United States Patent
Yoo et al.

(10) Patent No.: US 10,135,605 B2
(45) Date of Patent: Nov. 20, 2018

(54) CLOCK DATA RECOVERY CIRCUIT AND RECEIVER INCLUDING THE SAME

(71) Applicant: SAMSUNG ELECTRONICS CO., LTD., Suwon-si (KR)

(72) Inventors: Byoung-Joo Yoo, Seoul (KR); Kyung-Seok Song, Busan (KR); Ho-Bin Song, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/794,573

(22) Filed: Oct. 26, 2017

(65) Prior Publication Data
US 2018/0183567 A1    Jun. 28, 2018

(30) Foreign Application Priority Data
Dec. 28, 2016   (KR) .................. 10-2016-0181259

(51) Int. Cl.
| | | |
|---|---|---|
| *H04L 7/033* | (2006.01) | |
| *H03L 7/08* | (2006.01) | |
| *H04L 7/04* | (2006.01) | |
| *H03L 7/099* | (2006.01) | |
| *H03L 7/085* | (2006.01) | |

(52) U.S. Cl.
CPC ............ *H04L 7/0331* (2013.01); *H03L 7/085* (2013.01); *H03L 7/0807* (2013.01); *H03L 7/0995* (2013.01); *H04L 7/042* (2013.01)

(58) Field of Classification Search
CPC ..... H04L 7/0331; H04L 7/042; H03L 7/0807; H03L 7/085; H03L 7/0995
See application file for complete search history.

(56) References Cited

U.S. PATENT DOCUMENTS

| | | | |
|---|---|---|---|
| 7,620,136 B2 | 11/2009 | Sanders et al. | |
| 8,138,840 B2 | 3/2012 | Ainspan et al. | |
| 8,208,596 B2 | 6/2012 | Chatwin | |
| 8,798,217 B2 | 8/2014 | Kong et al. | |
| 8,803,573 B2 * | 8/2014 | Sindalovsky ........... H03L 7/087 327/147 |
| 8,938,043 B2 | 1/2015 | Bae et al. | |
| 8,981,824 B2 | 3/2015 | Park et al. | |
| 9,209,966 B1 | 12/2015 | Hossain et al. | |
| 9,325,332 B2 | 4/2016 | Ainspan et al. | |
| 9,432,028 B2 | 8/2016 | Kim et al. | |
| 9,831,880 B1 * | 11/2017 | Kuan ...................... H03L 7/093 |
| 2013/0009679 A1 | 1/2013 | Sindalovsky et al. | |
| 2015/0288370 A1 | 10/2015 | Deng et al. | |
| 2016/0164527 A1 | 6/2016 | Song et al. | |
| 2016/0233870 A1 | 8/2016 | Van Engelen et al. | |

FOREIGN PATENT DOCUMENTS

KR     10-1129055 B1     3/2012

\* cited by examiner

*Primary Examiner* — Kabir A Timory
(74) *Attorney, Agent, or Firm* — Sughrue Mion, PLLC

(57) ABSTRACT

A clock data recovery circuit configured to generate frequency step that is uniform regardless of operational conditions of the clock data recovery circuit.

20 Claims, 27 Drawing Sheets

FIG. 6

| | CALEN | SU | SD | GCON[i] | UPCON[i] | DPCON[i] |
|---|---|---|---|---|---|---|
| CALIBRATION MODE | H | H | H | H | H | H |
| | | | | L | L | L |
| NORMAL OPERATION MODE | L | UP | DNB | H | UP | DNB |
| | | | | L | L | H |

FIG. 9

| | CALEN | SU | SD | GCON[i] | UPCON[i] | DPCON[i] |
|---|---|---|---|---|---|---|
| CALIBRATION MODE | H | H | H | H | H | H |
| | | UP | DNB | L | L | L |
| NORMAL OPERATION MODE | L | | | H | UP | DNB |
| | | | | L | L | H |

FIG. 12

| | CALEN | SU | SD | GCOM[1] | UPCOM[1] | DPCOM[1] |
|---|---|---|---|---|---|---|
| CALIBRATION MODE | H | L | H | H | L | H |
| | | | | L | L | L |
| NORMAL OPERATION MODE | L | UP | DNB | H | UP | DNB |
| | | | | L | L | H |

CLOCK DATA RECOVERY CIRCUIT AND RECEIVER INCLUDING THE SAME

CROSS-REFERENCE TO RELATED APPLICATION

The present application claims priority under 35 USC § 119 from Korean Patent Application No. 10-2016-0181259, filed on Dec. 28, 2016, in the Korean Intellectual Property Office (KIPO), the disclosure of which is incorporated herein by reference in its entirety.

BACKGROUND

1. Field

Methods and apparatuses consistent with exemplary embodiments of the present application relate to semiconductor integrated circuits, and more particularly to a clock data recovery circuit and a receiver including a clock data recovery circuit.

2. Description of the Related Art

In recent electronic systems using complementary metal-oxide semiconductor (CMOS) integrated circuit (IC) technology, communication between chips may require fast speed and wide bandwidth. Accordingly, each of the communication chips may include a high-speed input/output (I/O) interface circuit such as a serial link. In serial link communication, data may be provided through a communication channel and a clock signal for receiving data may not be separately provided. Accordingly, a receiving system may include a clock data recovery circuit that extracts clock information and data information from serial data to process the serial data, for example, at a rate of several gigabits per second. If input jitter tolerance is not secured, the clock data recovery circuit may malfunction or performance of the clock data recovery circuit may be degraded.

SUMMARY

Methods and apparatuses consistent with exemplary embodiments provide a clock data recovery circuit having enhanced input jitter tolerance.

Methods and apparatuses consistent with exemplary embodiments provide a receiver including a clock data recovery circuit having enhanced input jitter tolerance.

According to an aspect of an exemplary embodiment, there is provided a clock data recovery circuit including a phase detector, a proportional path circuit, an integral path circuit, an oscillation circuit and a gain control circuit. The phase detector samples an input data signal in response to a recovered clock signal to generate a recovered data signal and detects a phase difference between the input data signal and the recovered clock signal to generate an up signal and a down signal. The proportional path circuit converts the up signal and the down signal to an up control signal and a down control signal based on a gate control signal. The integral path circuit integrates the up signal and the down signal to generate an integral control signal. The oscillation circuit generates the recovered clock signal and determine a frequency of the recovered clock signal based on the integral control signal and adjusts the frequency of the recovered clock signal by a frequency step based on the up control signal and the down control signal. The gain control circuit generates the gate control signal such that the frequency step is uniform regardless of operational conditions.

According to an aspect of an exemplary embodiment, there is provided a receiver includes a clock data recovery circuit configured to generate a recovered clock signal and a recovered data signal based on an input data signal that is received through a communication channel. The clock data recovery circuit includes a phase detector, a proportional path circuit, an integral path circuit, an oscillation circuit and a gain control circuit, as described above.

The clock data recovery circuit according to exemplary embodiments may implement a uniform frequency transfer characteristic regardless of the operational conditions by controlling the gain of the proportional path so that the frequency step of the recovered clock signal may be uniform regardless of the operational conditions, and thus performance of the clock data recovery circuit and the receiver including the clock data recovery circuit may be enhanced.

BRIEF DESCRIPTION OF THE DRAWINGS

Exemplary embodiments of the present disclosure will be more clearly understood from the following detailed description taken in conjunction with the accompanying drawings, in which:

FIGS. 6 and 7 are diagrams illustrating operations of the up proportional path circuit and the down proportional path circuit, according to an exemplary embodiment;

FIGS. 9 and 10 are diagrams illustrating operations of the up proportional path circuit and the down proportional path circuit, according to an exemplary embodiment;

FIGS. 12 and 13 are diagrams illustrating operations of the up proportional path circuit and the down proportional path circuit, according to an exemplary embodiment;

DETAILED DESCRIPTION OF THE EXEMPLARY EMBODIMENTS

Figure 1:
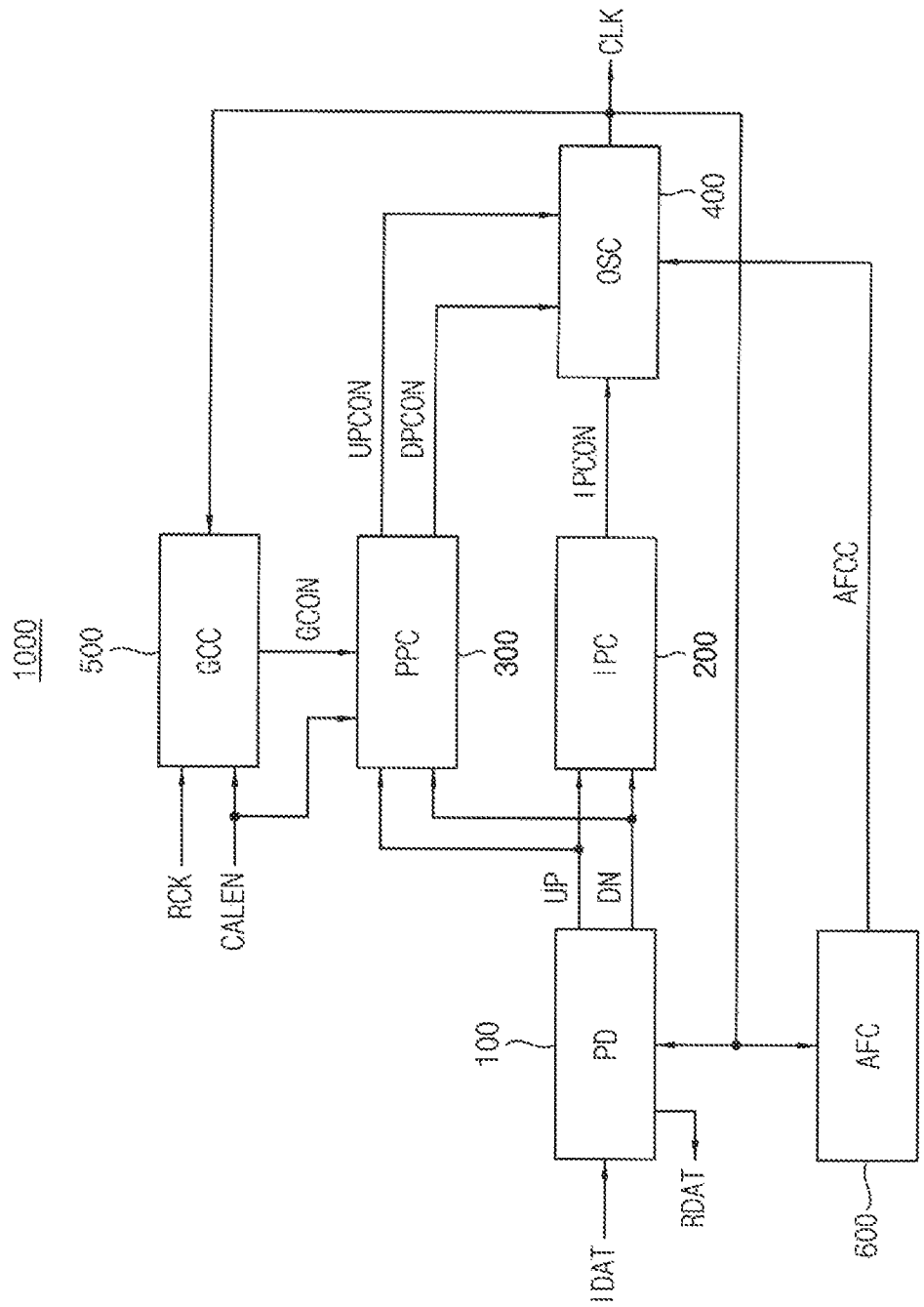
FIG. 1 is a block diagram illustrating a clock data recovery circuit according to an exemplary embodiment.

Various example embodiments will be described more fully hereinafter with reference to the accompanying drawings, in which some example embodiments are shown. In the drawings, like numerals refer to like elements throughout. To avoid unnecessarily obscuring the details of the exemplary embodiments, redundant descriptions may be omitted.

FIG. 1 is a block diagram illustrating a clock data recovery circuit according to an exemplary embodiment.

Referring to FIG. 1, a clock data recovery circuit 1000 may include a phase detector PD 100, an integral path circuit IPC 200, a proportional path circuit PPC 300, an oscillation circuit OSC 400 and a gain control circuit GCC 500. The clock data recovery circuit 1000 may further include an automatic frequency control circuit AFC 600.

The phase detector 100 may receive an input data signal IDAT through a communication channel from an external transmitter and receive a recovered clock signal CLK that is generated in the clock data recovery circuit 1000. The phase detector 100 may sample the input data signal IDAT in response to the recovered clock signal CLK to generate a recovered data signal RDAT. The phase detector 100 may, for example, sample the input data signal IDAT at rising edges of the recovered clock signal CLK or at falling edges of the recovered clock signal CLK.

The phase detector 100 may detect a phase difference between the input data signal IDAT and the recovered clock signal RDAT to generate an up signal UP and a down signal DN.

In an exemplary embodiment, the phase detector 100 may be a bang-bang phase detector. As will be described below with reference to FIG. 25, the bang-bang phase detector may generate the up signal UP and the down signal DN that to have complementary logic levels. For example, the logic high level of the up signal UP may indicate that the input data signal IDAT precedes the recovered clock signal CLK and the logic high level of the down signal DN may indicate that the recovered clock signal CLK precedes the input data signal IDAT.

In an exemplary embodiment, the phase detector 100 may be a linear phase detector. As will be described below with reference to FIG. 26, the linear phase detector may generate the up signal UP and the down signal DN that have a pulse width difference in proportion to a phase difference between the input data signal IDAT and the recovered clock signal CLK. In other words, the pulse width difference between the up signal UP and the down signal DN increases as the phase difference between the input data signal IDAT and the recovered clock signal CLK increases.

The proportional path circuit 300 may convert the up signal UP and the down signal DN to an up control signal UPCON and a down control signal DPCON based on a gate control signal GCON. Exemplary embodiments of the proportional path circuit 300 will be described below with reference to FIGS. 4 through 13.

The integral path circuit 200 may integrate the up signal UP and the down signal DN to generate an integral control signal IPCON or an analog control signal. In some exemplary embodiments, the integral path circuit 200 may be implemented to provide the integral control signal IPCON as an analog signal. For example, the integral path circuit 200 may include a charge pump and a low pass filter to generate an analog voltage signal as the integral control signal IPCON. In addition, the integral path circuit 200 may further include a voltage-current converter to generate an analog current signal as the integral control signal IPCON. In other exemplary embodiments, the integral path circuit 200 may be implemented to provide the integral control signal IPCON as a digital signal. For example, the integral path circuit 200 may include a digital loop filter that performs digital filtering of the up signal UP and the down signal DN to generate a digital control code as the integral control signal IPCON.

The oscillation circuit 400 may determine a frequency of the recovered clock signal CLK based on the integral control signal IPCON. In addition, the oscillation circuit 400 may adjust the frequency of the recovered clock signal CLK by a frequency step $f_{BB}$ based on the up control signal UPCON and the down control signal DPCON. The oscillation circuit 400 may be implemented with a digitally-controlled oscillator, an analog-controlled oscillator, or an oscillator of an mixed type of digital and analog according to a type of the integral control signal IPCON, whether to include the automatic frequency control circuit 600, etc.

The oscillation circuit 400 may generate the recovered clock signal CLK having a frequency corresponding to a frequency of the integral control signal IPCON. For example, the oscillation circuit 400 may generate the recovered clock signal CLK having a relatively high frequency when the integral control signal IPCON has a relatively large value.

The oscillation circuit 400 may adjust the frequency of the recovered clock signal CLK by the frequency step $f_{BB}$ based on the up control signal UPCON and the down control signal DPCON. In some exemplary embodiments, the oscillation circuit 400 may increase the frequency of the recovered clock signal CLK by the frequency step $f_{BB}$ when the up signal UP has a pulse width wider than a pulse width of the down signal DN, and decrease the frequency of the recovered clock signal CLK by the frequency step $f_{BB}$ when the down signal DN has a pulse width wider than a pulse width of the up signal UP. In other exemplary embodiments, the oscillation circuit 400 may increase the frequency of the recovered clock signal CLK by the frequency step $f_{BB}$ when the up signal UP is activated, and decrease the frequency of the recovered clock signal CLK by the frequency step $f_{BB}$ when the down signal DN is activated.

The automatic frequency control circuit 600 may generate an automatic frequency control code AFCC so that the frequency of the recovered clock signal CLK may approach a target frequency. For example, the automatic frequency control circuit 600 may compare the recovered clock signal CLK and a reference clock signal to generate the automatic frequency control code AFCC. When the clock data recovery circuit 1000 includes the automatic frequency control circuit 600, the oscillation circuit 400 may include a digital control portion to adjust an operation voltage or current based on the automatic frequency control code AFCC.

The gain control circuit 500 may generate the gate control signal GCON such that the frequency step $f_{BB}$ may be uniform regardless of operational conditions. The operational conditions may include process variations in manufacturing the clock data recovery circuit 1000, an operation voltage or current of the clock data recovery circuit 1000, etc.

The clock data recovery circuit 1000 of FIG. 1 may include two paths, that is, a proportional path and an integral path, to control frequency and phase of the recovered clock signal CLK. In such second-order clock data recovery circuit 1000, the skew between the input data signal IDAT and the recovered clock signal CLK may be represented by the up signal UP and the down signal DN, which may be transferred to the oscillation circuit 400 through the proportional path and the integral path. The proportional path circuit 300 may transfer the skew between the input data signal IDAT and the recovered clock signal CLK, which is detected by the phase detector 100, to the oscillation circuit 400 without filtering to quickly reflect phase change. In contrast, the integral path circuit 200 may accumulate phase and frequency information, which is detected by the phase detector 100, to less rapidly change the frequency.

The bandwidth of the clock data recovery circuit 1000 is proportional to the frequency step $f_{BB}$. If the frequency step $f_{BB}$ is changed by the operational conditions such as process, voltage and temperature variation (PVT), also the bandwidth of the clock data recovery circuit 1000 is changed. The change of the bandwidth may affect jitter tolerance, jitter transfer and loop stability of the clock data recovery circuit 1000 and malfunction may be caused in the clock data recovery circuit 1000.

The clock data recovery circuit 1000 according to exemplary embodiments may implement uniform frequency transfer characteristic regardless of the operational conditions by controlling the gain of the proportional path so that the frequency step $f_{BB}$ of the recovered clock signal CLK may be uniform regardless of the operational conditions, and thus performance of the clock data recovery circuit 1000 and the receiver including the clock data recovery circuit 1000 may be enhanced.

Figure 2:
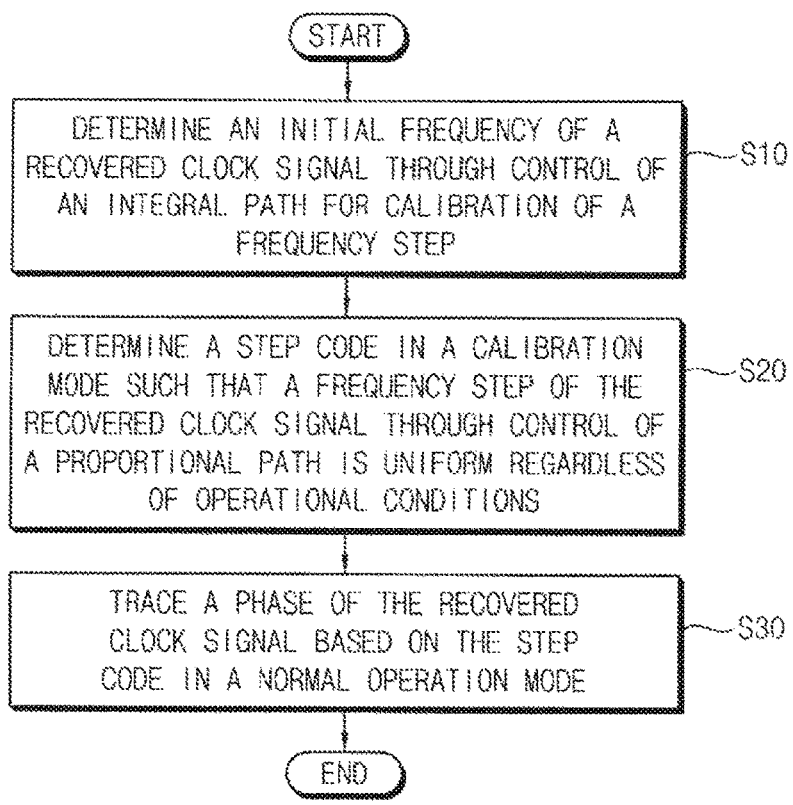
FIG. 2 is a flow chart illustrating a method of operating a clock data recovery circuit according to an exemplary embodiment.

FIG. 2 is a flow chart illustrating a method of operating a clock data recovery circuit according to an exemplary embodiment.

Referring to FIG. 2, an initial frequency $f_o$ of a recovered clock signal CLK is determined through control of an integral path for calibration of a frequency step $f_{BB}$ (S10). The determination of the initial frequency $f_o$ may include determining the value or the level of the integral control signal IPCON as described with reference to FIG. 1. When the clock data recovery circuit 1000 includes the automatic frequency control circuit 600, the determination of the initial frequency $f_o$ may include determining the automatic frequency control code AFCC.

After the initial frequency $f_o$ is determined, a step code STC is determined in a calibration mode such that a frequency step $f_{BB}$ of the recovered clock signal CLK through control of a proportional path is uniform regardless of operational conditions (S20). In other words, the gain of the proportional path may be determined in the calibration mode while the value or the level of the integral control signal IPCON is fixed. When the clock data recovery circuit 1000 includes the automatic frequency control circuit 600, the gain of the proportional path may be determined while the automatic frequency control code AFCC is fixed.

In a normal operation mode, a phase of the recovered clock signal CLK is traced based on the step code STC (S30). The phase trace in the normal operation mode will be described below with reference to FIGS. 25 and 26.

Figure 3:
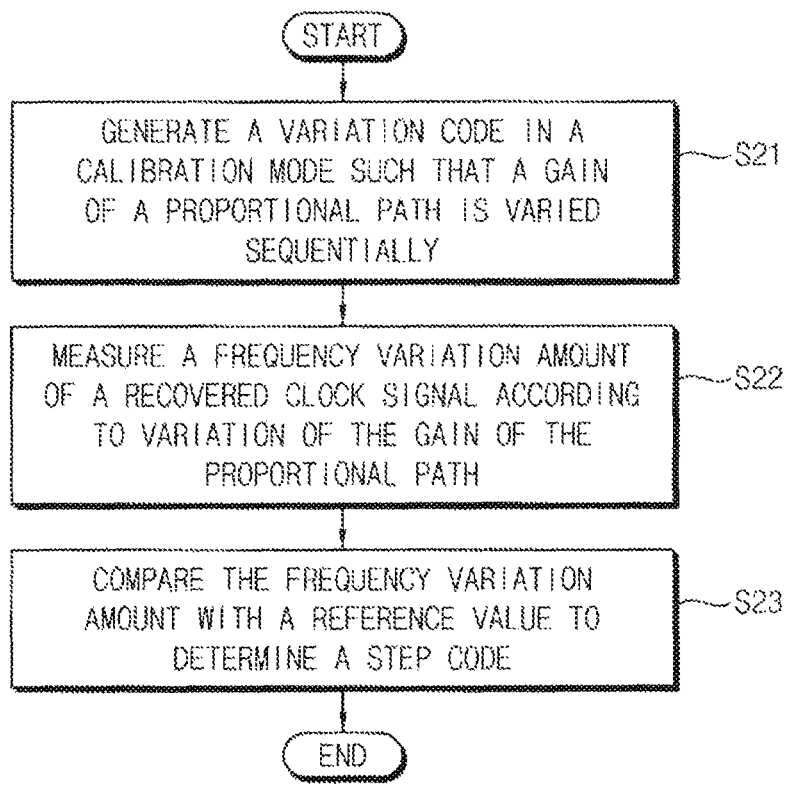
FIG. 3 is a flow chart illustrating a method of calibrating a frequency step according to an exemplary embodiment.

FIG. 3 is a flow chart illustrating a method of calibrating a frequency step according to an exemplary embodiment.

According to exemplary embodiments, calibration of the frequency step $f_{BB}$ indicates determining the step code STC corresponding to a gain of the proportional path such that the frequency step $f_{BB}$ may be uniform regardless of the operational conditions.

Referring to FIG. 3, a variation code VRC is generated in the calibration mode such that a gain of the proportional path is sequentially varied (S21). The variation code VRC may be provided as a gain control signal GCON in the calibration mode. The gain of the proportional path may be varied and the frequency of the recovered clock signal CLK may be varied accordingly as the variation code VRC is sequentially varied. A frequency variation amount of the recovered clock signal CLK is measured according to the variation of the gain of the proportional path (S22). The frequency variation amount is compared with a reference value to determine the step code STC (S23). The determined step code STC may be provided as the gain control signal GCON in the normal operation mode.

Hereinafter, exemplary embodiments of the calibration of the frequency step $f_{BB}$, that is, the determination of the step code STC, are described with reference to FIGS. 4 through 17. In the calibration mode, a variation code VRC sequentially varied may be provided as the gate control signal GCON to determine the step code STC corresponding to the frequency step $f_{BB}$ that is uniform regardless of the operational conditions. In the normal operation mode, the step code STC determined in the calibration mode may be provided as the gate control signal GCON.

Figure 4:
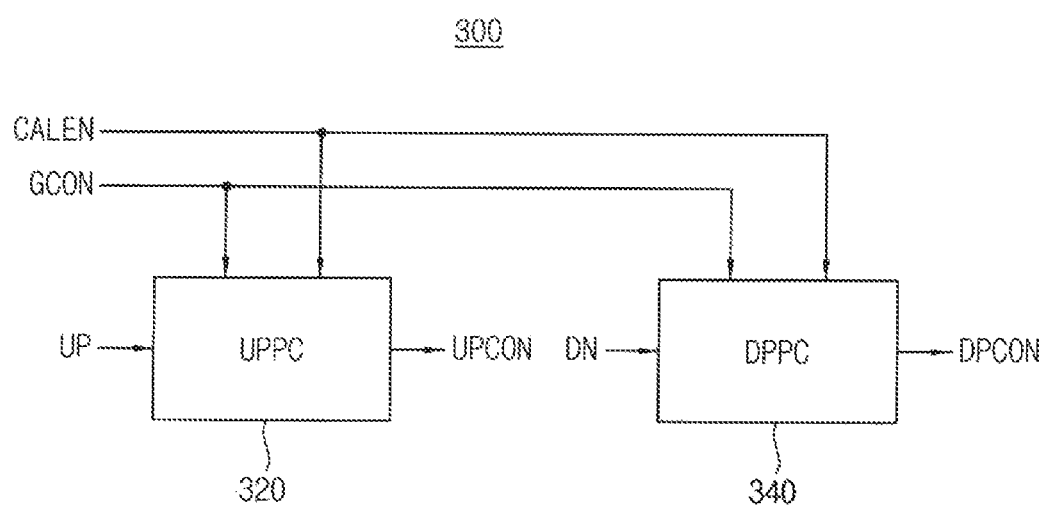
FIG. 4 is a block diagram illustrating an a proportional path circuit included in the clock data recovery circuit according to an exemplary embodiment.

FIG. 4 is a block diagram illustrating a proportional path circuit included in the clock data recovery circuit of FIG. 1, according to an exemplary embodiment.

Referring to FIG. 4, a proportional path circuit 300 may include an up proportional path circuit UPPC 320 and a down proportional path circuit DPPC 340. The up proportional path circuit 320 may convert an up signal UP to an up control signal UPCON based on a gate control signal GCON. The down proportional path circuit 340 may convert a down signal DN to a down control signal DPCON based on the gate control signal GCON.

The gain control signal GCON, the up control signal UPCON and the down control signal DPCON may be implemented as digital signals. As will be described below, each of the gain control signal GCON, the up control signal UPCON and the down control signal DPCON may be a signal of multiple bits such that each bit may be represented by a logic high level or a logic low level. Through such digitalization, reliance of circuit blocks associated with calibration and application of the frequency step $f_{BB}$ may be enhanced, and reduction of noise and occupation area may be realized. The proportional path circuit 300 of FIG. 4 may operate in the calibration mode or in the normal operation mode in response to a calibration enable signal CALEN. For example, the logic high level of the calibration enable signal CALEN may indicate the calibration mode and the logic low level of the calibration enable signal CALEN may indicate the normal operation mode. In some example embodiments, the calibration enable signal CALEN may be provided by a control circuit of a receiver including the clock data recovery circuit.

Figure 5A:
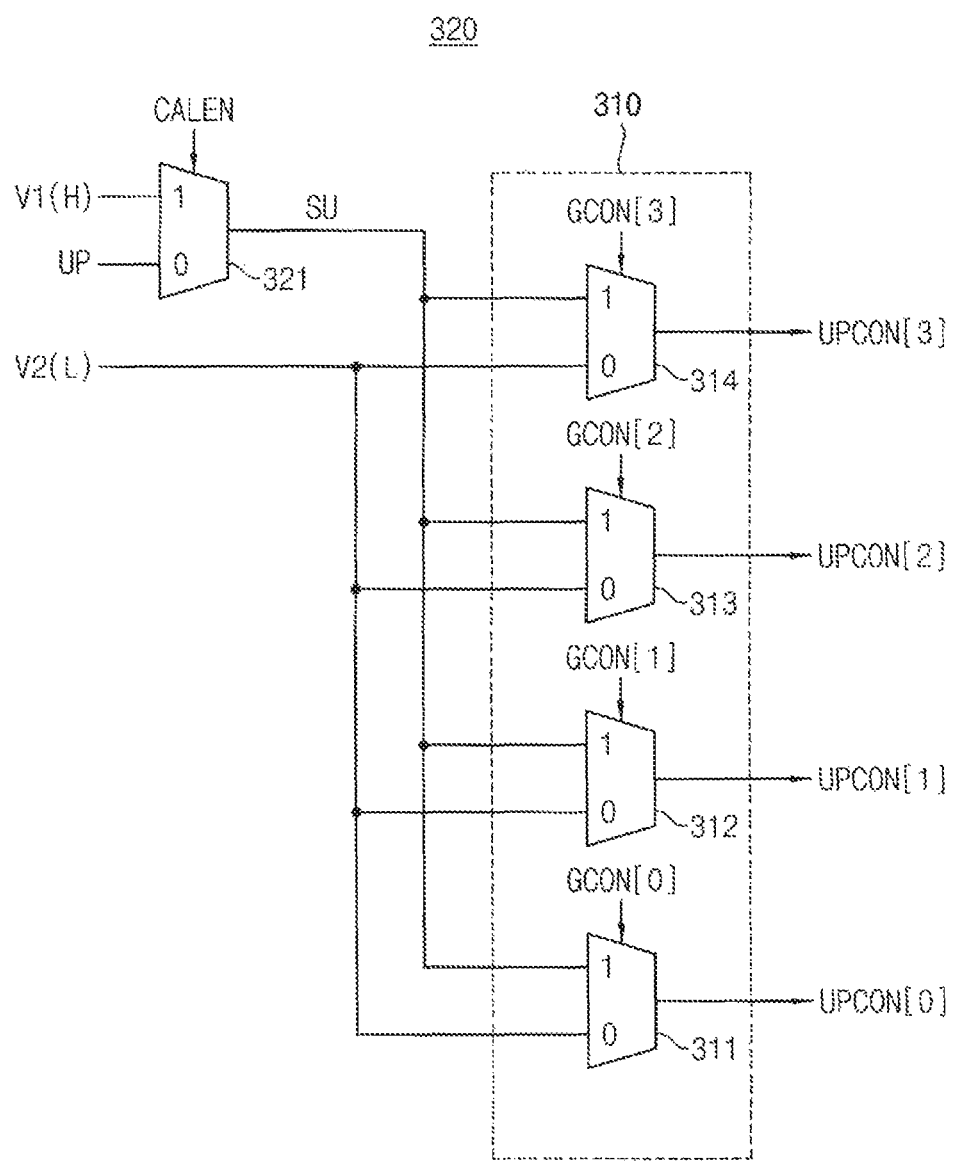
FIGS. 5A and 5B are diagrams illustrating an up proportional path circuit and a down proportional path circuit included in the proportional path circuit, according to an exemplary embodiment.
Figure 5B:
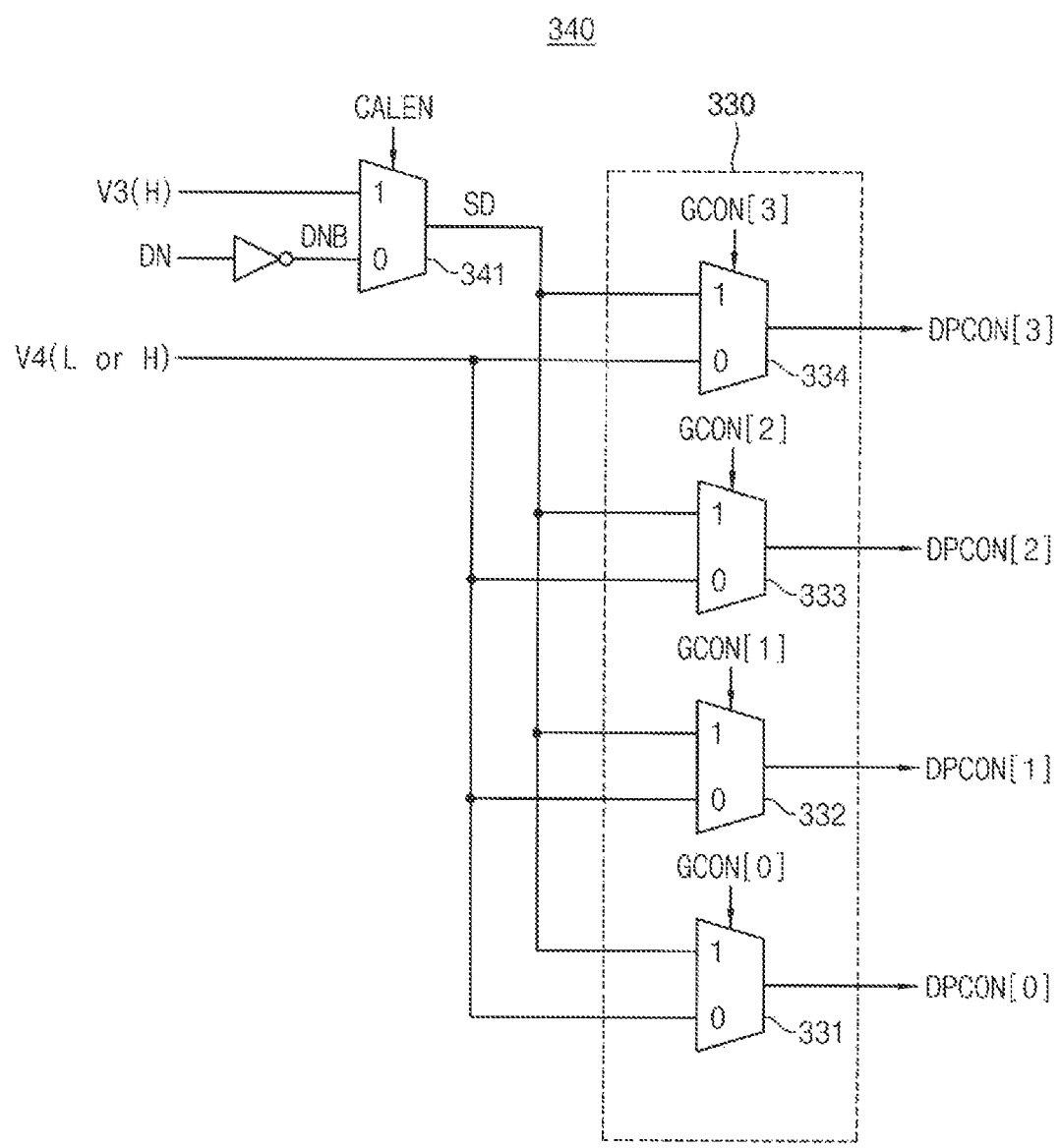

FIGS. 5A and 5B are diagrams of an up proportional path circuit and a down proportional path circuit included in the proportional path circuit of FIG. 4, according to an exemplary embodiment.

FIGS. 5A and 5B illustrate non-limiting examples that the gate control signal GCON, the up control signal UPCON, and the down control signal DPCON are four-bit signals, and the bit numbers of the signals GCON, UPCON and DPCON may be variously determined.

Referring to FIG. 5A, an up proportional path circuit 320 may include an up signal selector 321 and an up bit generation circuit 310. The up bit generation circuit 310 may include a plurality of up bit selectors 311, 312, 313 and 314.

The up signal selector 321 may select a first voltage signal V1 or an up signal UP in response to a calibration enable signal CALEN to output an up selection signal SU. The plurality of up bit selectors 311, 312, 313 and 314 may select a second voltage signal V2 or the up selection signal SU based on multiple bits GCON[0]~GCON[3] of the gate control signal GCON to output multiple bits UPCON[0]~UPCON[3] of the up control signal UPCON, respectively.

The first voltage signal V1 and the second voltage signal V2 may have fixed voltage levels. For example, the first voltage signal V1 may have a logic high level H and the second voltage signal V2 may have a logic low level L.

Referring to FIG. 5B, a down proportional path circuit 340 may include a down signal selector 341 and a down bit generation circuit 330. The down bit generation circuit 330 may include a plurality of down bit selectors 331, 332, 333 and 334.

The down signal selector 341 may select a third voltage signal V3 or an inversion signal DNB of a down signal DN in response to the calibration enable signal CALEN to output a down selection signal SD. The plurality of down bit selectors 331, 332, 333 and 334 may select a fourth voltage signal V4 or the down selection signal SD based on the multiple bits GCON[0]~GCON[3] of the gate control signal GCON to output multiple bits DPCON[0]~DPCON[3] of the down control signal DPCON, respectively.

The third voltage signal V3 and the fourth voltage signal V4 may have fixed voltage levels. For example, the third voltage signal V3 may have the logic high level H and the fourth voltage signal V4 may have the logic low level L in the calibration mode and the logic high level H in the normal operation mode.

As a result, both of the up proportional path circuit 320 of FIG. 5A and the down proportional path circuit 340 of FIG. 5B may be enabled in the calibration mode.

Figure 7:
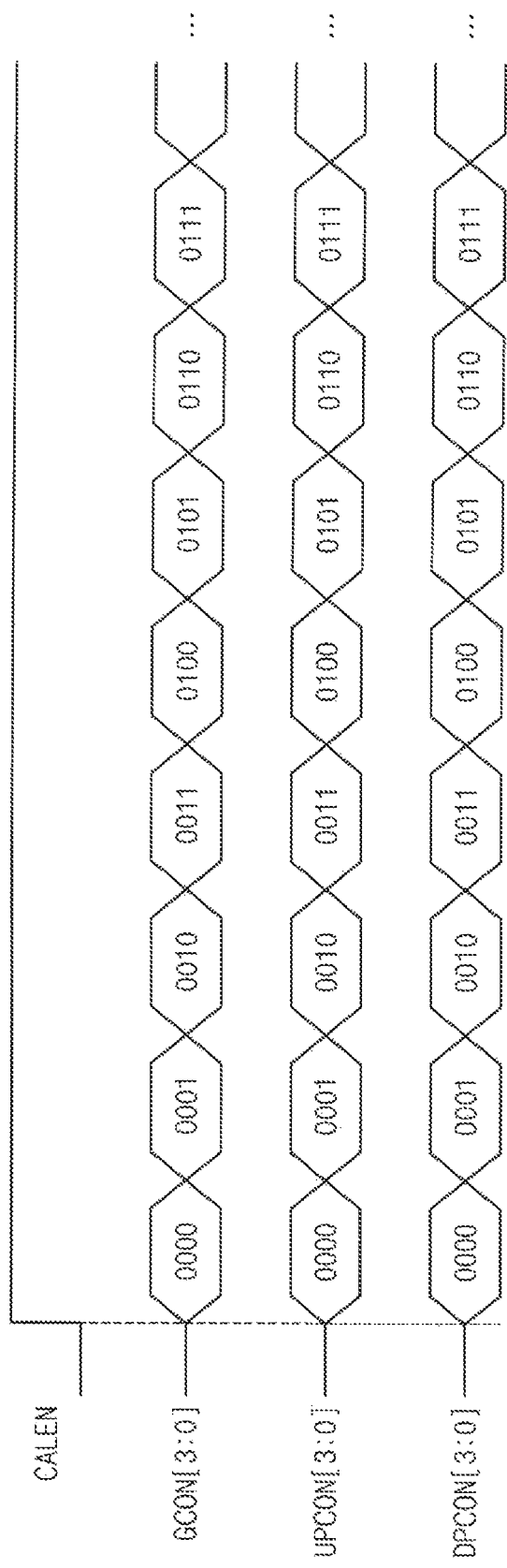

FIGS. 6 and 7 are diagrams illustrating operations of the up proportional path circuit of FIG. 5A and the down proportional path circuit of FIG. 5B, according to an exemplary embodiment.

Referring to FIG. 6, the logic high level H of the calibration enable signal CALEN may indicate the calibration mode and the logic low level L of the calibration enable signal CALEN may indicate the normal operation mode. The up selection signal SU may correspond to the first voltage signal V1, that is, the logic high level H in the calibration mode and correspond to the up signal UP in the normal operation mode. The down selection signal SD may correspond to the third voltage signal V3, that is, the logic high level H in the calibration mode and correspond to the inversion signal DNB of the down signal DN in the normal operation mode.

Each bit UPCON[i] (i=1, 2, 3 or 4) of the up control signal UPCON and each bit DPCON[i] of the down control signal DPCON may be determined in response to each bit GCON[i] of the gate control signal GCON.

When each bit GCON[i] of the gate control signal GCON is deactivated in the logic low level L in the calibration mode and the normal operation mode, each bit UPCON[i] of the up control signal UPCON may correspond to the second voltage signal V2, that is, the logic low level L and each bit DPCON[i] of the down control signal DPCON may correspond to the fourth voltage signal V4, that is, the logic low level L in the calibration mode and the logic high level H in the normal operation mode.

When each bit GCON[i] of the gate control signal GCON is activated in the logic high level H in the calibration mode, each bit UPCON[i] of the up control signal UPCON may correspond to the up selection signal SU, that is, the logic high level H, and each bit DPCON[i] of the down control signal DPCON may correspond to the down selection signal SD, that is, the logic high level H.

When each bit GCON[i] of the gate control signal GCON is activated in the logic high level H in the normal operation mode, each bit UPCON[i] of the up control signal UPCON may correspond to the up selection signal SU, that is, the up signal UP, and each bit DPCON[i] of the down control signal DPCON may correspond to the down selection signal SD, that is, the inversion signal DNB of the down signal DN.

Referring to FIG. 7, in the calibration mode while the calibration enable signal CALEN is activated, the gate control circuit 500 of FIG. 1 may generate the variation code VRC that sequentially varies. In some exemplary embodiments, the variation code VRC may sequentially increase from the minimum value of '0000' as illustrated in FIG. 7. In other exemplary embodiments, the variation code VRC may sequentially decrease from the maximum value of '1111'. The variation code VRC varying as such may be provided as the gate control signal GCON[3:0] to the proportional path circuit 300.

The proportional path circuit 300 may generate the up control signal UPCON[3:0] sequentially increasing and the down control signal DPCON[3:0] sequentially increasing in response to the gate control signal GCON[3:0] sequentially increasing in the calibration mode. As will be described below with reference to FIGS. 18 and 19, the frequency of the recovered clock signal CLK may increase as the up control signal UPCON[3:0] increases, and also the frequency of the recovered clock signal CLK may increase as the down control signal DPCON[3:0] increases.

As such, the gain control circuit 500 may generate the gate control signal GCON sequentially varying and the proportional path circuit 300 may generate the up control signal UPCON sequentially varying and the down control signal DPCON sequentially varying, in the calibration mode. As a result, the frequency of the recovered clock signal CLK may sequentially vary according to the gate control signal GCON sequentially varying and the step code STC corresponding to the frequency step $f_{BB}$ may be determined by measuring the frequency variation amount.

Both of the up proportional path circuit 320 of FIG. 5A and the down proportional path circuit 340 of FIG. 5B are enabled in the calibration mode. Accordingly, as described with reference to FIGS. 6 and 7, each of the up control signal UPCON[3:0] and the down control signal DPCON[3:0] may incrementally increase if the gate control signal GCON[3:0] incrementally increases (e.g., by one).

Figure 8:
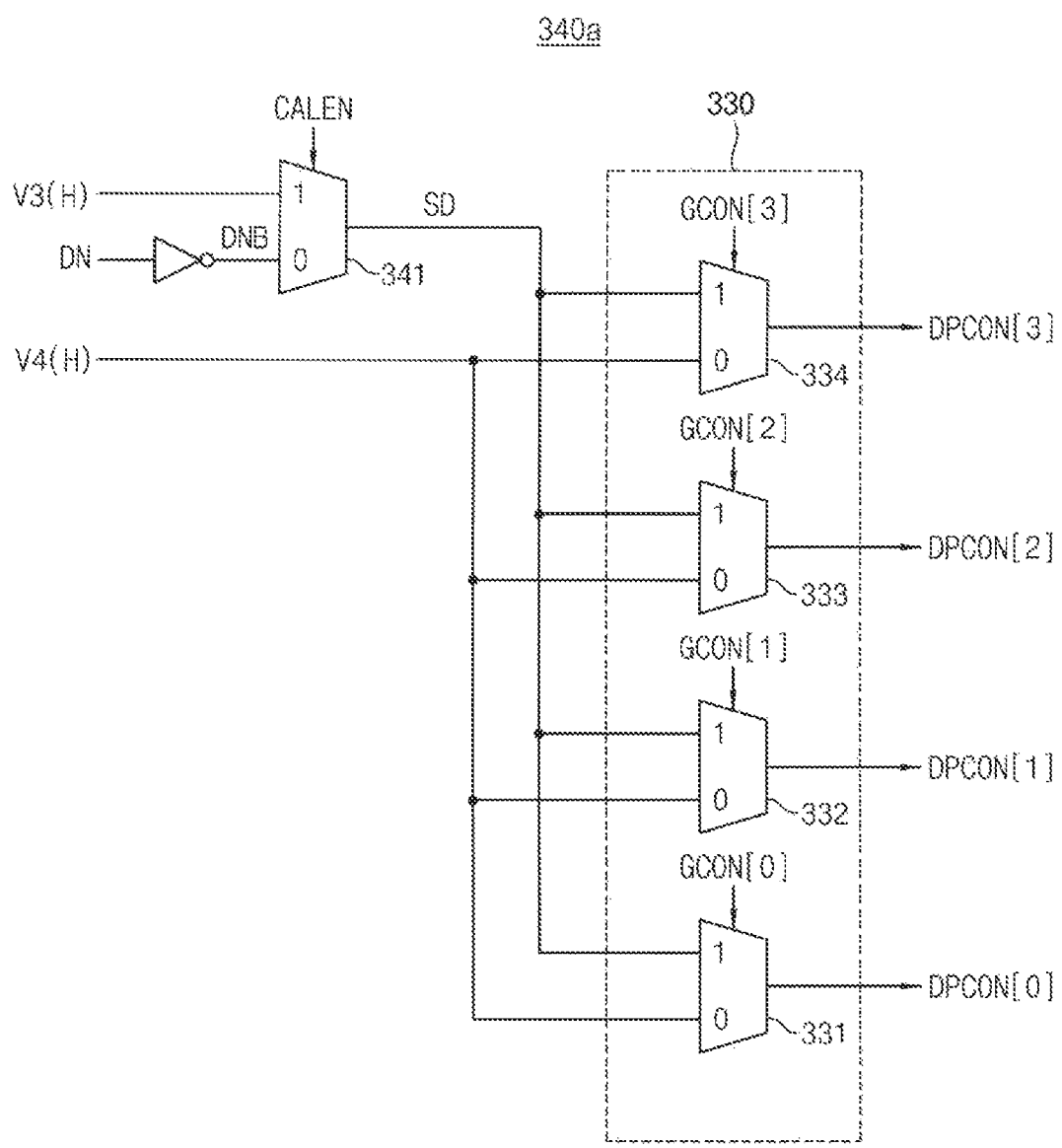
FIG. 8 is a diagram illustrating a down proportional path circuit included in the proportional path circuit, according to an exemplary embodiment.

FIG. 8 is a diagram illustrating a down proportional path circuit included in the proportional path circuit of FIG. 4, according to an exemplary embodiment.

Referring to FIG. 8, a down proportional path circuit 340a may include a down signal selector 341 and a down bit generation circuit 330. The down bit generation circuit 330 may include a plurality of down bit selectors 331, 332, 333 and 334.

The down signal selector 341 may select a third voltage signal V3 or an inversion signal DNB of a down signal DN in response to the calibration enable signal CALEN to output a down selection signal SD. The plurality of down bit selectors 331, 332, 333 and 334 may select a fourth voltage signal V4 or the down selection signal SD based on the multiple bits GCON[0]~GCON[3] of the gate control signal GCON to output multiple bits DPCON[0]~DPCON[3] of the down control signal DPCON, respectively.

The third voltage signal V3 and the fourth voltage signal V4 may have fixed voltage levels. For example, both of the third voltage signal V3 and the fourth voltage signal V4 may have the logic high level H. As a result, the down proportional path circuit 340a of FIG. 8 may be disabled in the calibration mode. In other words, the down control signal DPCON[3:0] may have the fixed value of '1111' regardless of the value of the gain control signal GCON[3:0].

Figure 10:
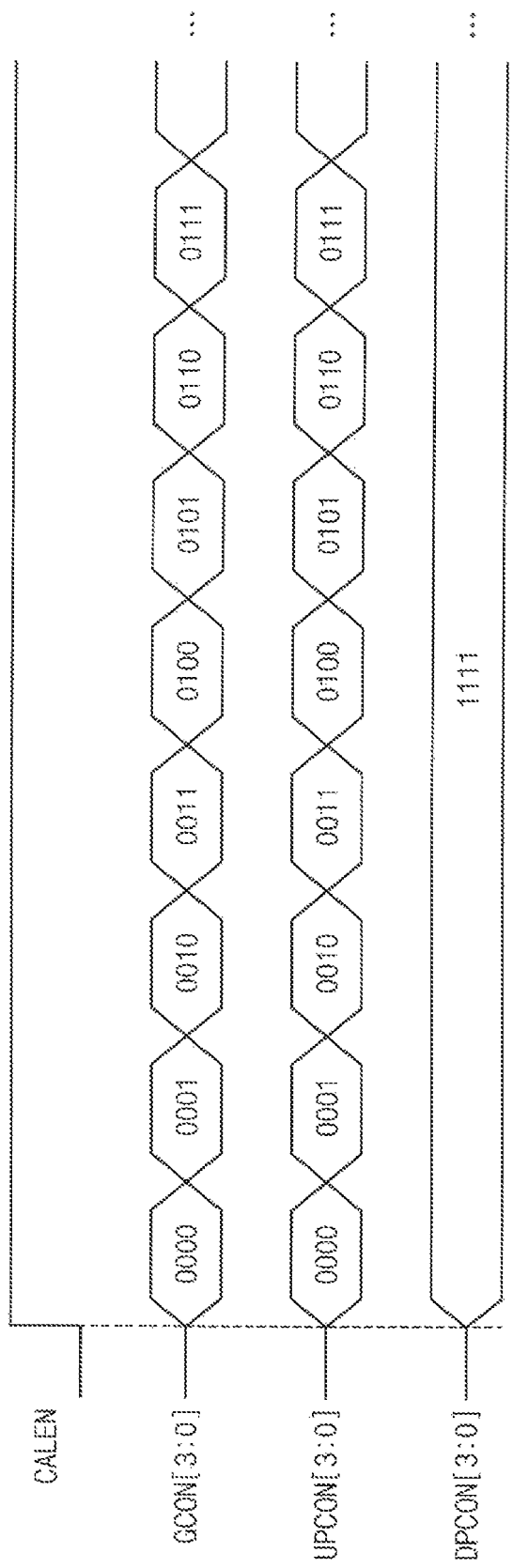

FIGS. 9 and 10 are diagrams illustrating operations of the up proportional path circuit of FIG. 5A and the down proportional path circuit of FIG. 8, according to an exemplary embodiment.

In the calibration mode, the up proportional path circuit 320 of FIG. 5A is enabled, but the down proportional path circuit 340a of FIG. 8 is disabled. Hereinafter, the descriptions of FIGS. 6 and 7 are not repeated.

Referring to FIG. 9, each bit UPCON[i] (i=1, 2, 3 or 4) of the up control signal UPCON and each bit DPCON[i] of the down control signal DPCON may be determined based on the received bit GCON[i] of the gate control signal GCON. In the calibration mode, however, each bit DPCON[i] of the down control signal DPCON may be fixed to the logic high level H regardless of each bit GCON[i] of the gate control signal GCON.

When each bit GCON[i] of the gate control signal GCON is deactivated in the logic low level L in the calibration mode and the normal operation mode, each bit UPCON[i] of the up control signal UPCON may correspond to the second voltage signal V2, that is, the logic low level L and each bit DPCON[i] of the down control signal DPCON may correspond to the fourth voltage signal V4, that is, the logic high level H.

When each bit GCON[i] of the gate control signal GCON is activated in the logic high level H in the calibration mode, each bit UPCON[i] of the up control signal UPCON may correspond to the up selection signal SU, that is, the logic high level H, and each bit DPCON[i] of the down control signal DPCON may correspond to the down selection signal SD, that is, the logic high level H.

When each bit GCON[i] of the gate control signal GCON is activated in the logic high level H in the normal operation mode, each bit UPCON[i] of the up control signal UPCON may correspond to the up selection signal SU, that is, the up signal UP, and each bit DPCON[i] of the down control signal DPCON may correspond to the down selection signal SD, that is, the inversion signal DNB of the down signal DN.

Referring to FIG. 10, in the calibration mode while the calibration enable signal CALEN is activated, the gate control circuit 500 of FIG. 1 may generate the sequentially increasing variation code VRC.

The proportional path circuit 300 may generate the up control signal UPCON[3:0] sequentially increasing based on the gate control signal GCON[3:0] sequentially increasing and the down control signal DPCON[3:0] having a fixed value, for example, of '1111'. As will be described below with reference to FIGS. 18 and 19, the frequency of the recovered clock signal CLK may increase as the up control signal UPCON[3:0] increases, and also the frequency of the recovered clock signal CLK may increase as the down control signal DPCON[3:0] increases. As a result, the frequency of the recovered clock signal CLK may sequentially increase as the gate control signal GCON increases in the calibration mode.

As such, the gain control circuit 500 may generate the gate control signal GCON sequentially varying and the proportional path circuit 300 may generate the up control signal UPCON sequentially varying and the down control signal DPCON having a fixed value, in the calibration mode. As a result, the frequency of the recovered clock signal CLK may sequentially vary according to the gate control signal GCON sequentially varying and the step code STC corresponding to the frequency step $f_{BB}$ may be determined by measuring the frequency variation amount.

Figure 11:
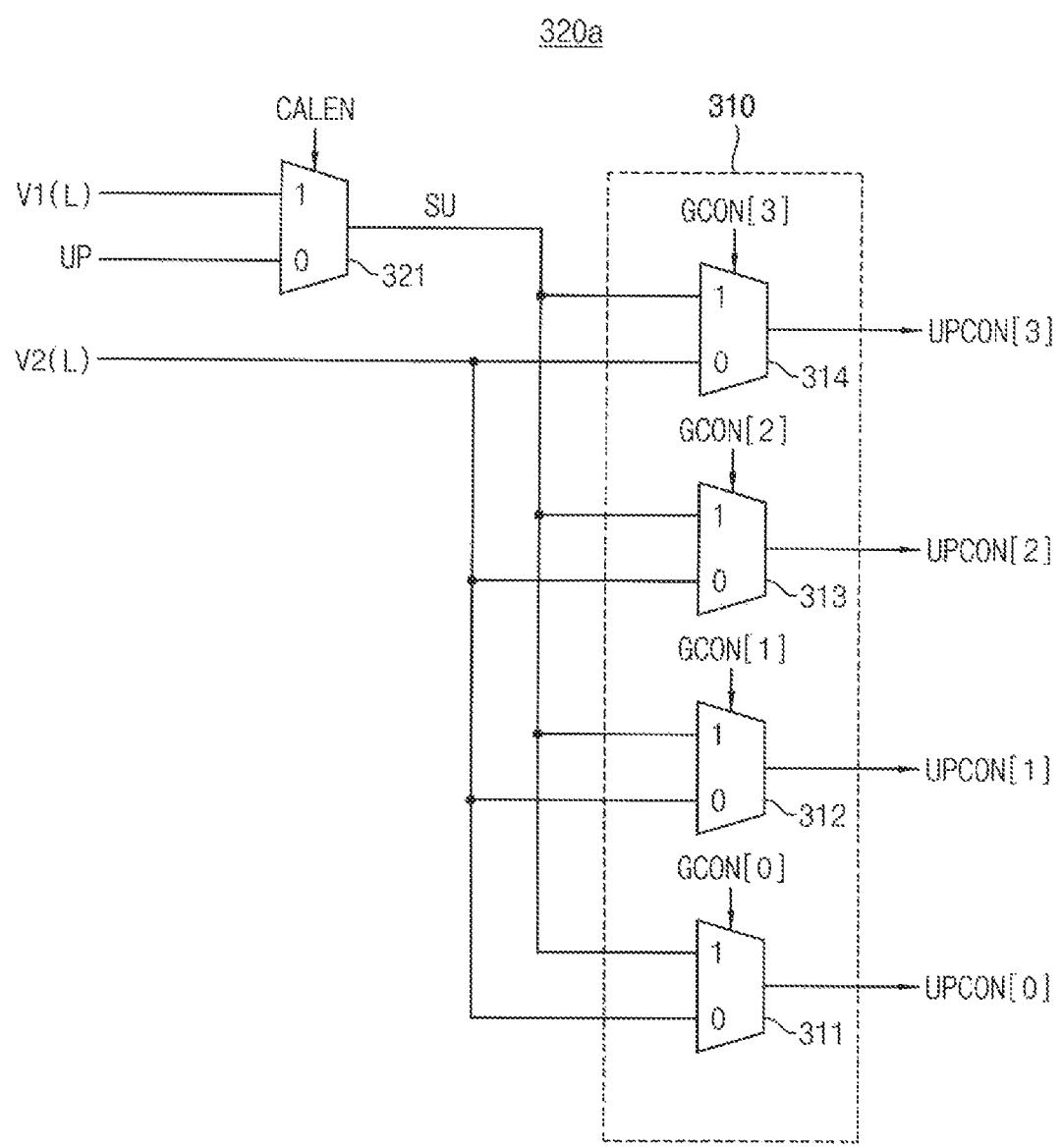
FIG. 11 is a diagram illustrating an up proportional path circuit included in the proportional path, according to an exemplary embodiment.

FIG. 11 is a diagram illustrating an up proportional path circuit included in the proportional path circuit of FIG. 4, according to an exemplary embodiment.

Referring to FIG. 11, an up proportional path circuit 320a may include an up signal selector 321 and an up bit generation circuit 310. The up bit generation circuit 310 may include a plurality of up bit selectors 311, 312, 313 and 314.

The up signal selector 321 may select a first voltage signal V1 or an up signal UP in response to a calibration enable signal CALEN to output an up selection signal SU. The plurality of up bit selectors 311, 312, 313 and 314 may select a second voltage signal V2 or the up selection signal SU based on multiple bits GCON[0]~GCON[3] of the gate control signal GCON to output multiple bits UPCON[0]~UPCON[3] of the up control signal UPCON, respectively.

The first voltage signal V1 and the second voltage signal V2 may have fixed voltage levels. For example, both of the first voltage signal V1 and the second voltage signal V2 may have the logic low level L. As a result, the up proportional path circuit 320a of FIG. 11 may be disabled in the calibration mode. In other words, the up control signal UPCON[3:0] may have the fixed value of '0000' regardless of the value of the gain control signal GCON[3:0].

Figure 13:
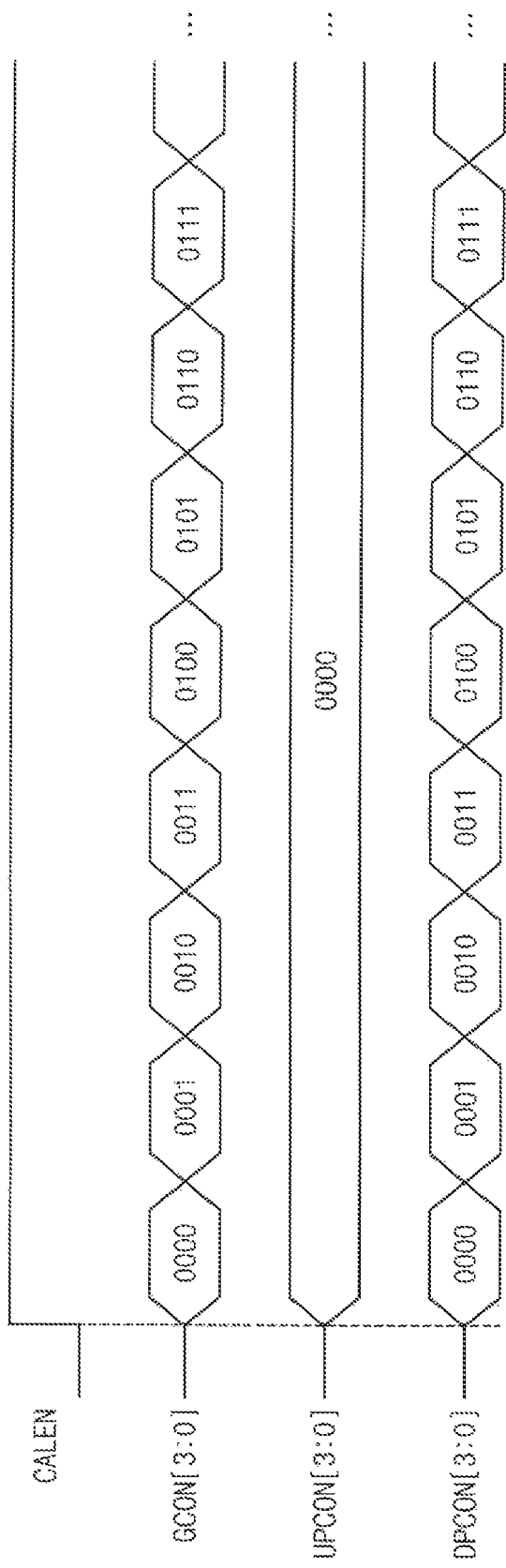

FIGS. 12 and 13 are diagrams illustrating operations of the up proportional path circuit of FIG. 11 and the down proportional path circuit of FIG. 5B, according to an exemplary embodiment.

In the calibration mode, the up proportional path circuit 320a of FIG. is disabled but the down proportional path circuit 340 of FIG. 5B is enabled. Again, the descriptions of FIGS. 6 and 7 are not repeated.

Referring to FIG. 12, each bit UPCON[i] (i=1, 2, 3 or 4) of the up control signal UPCON and each bit DPCON[i] of the down control signal DPCON may be determined in response to each bit GCON[i] of the gate control signal GCON. In the calibration mode, however, each bit UPCON[i] of the up control signal UPCON may be fixed to the logic low level L regardless of each bit GCON[i] of the gate control signal GCON.

When each bit GCON[i] of the gate control signal GCON is deactivated in the logic low level L in the calibration mode and the normal operation mode, each bit UPCON[i] of the up control signal UPCON may correspond to the second voltage signal V2, that is, the logic low level L and each bit DPCON[i] of the down control signal DPCON may correspond to the fourth voltage signal V4, that is, the logic low level L in the calibration mode and the logic high level H in the normal operation mode.

When each bit GCON[i] of the gate control signal GCON is activated in the logic high level H in the calibration mode, each bit UPCON[i] of the up control signal UPCON may correspond to the up selection signal SU, that is, the logic low level L, and each bit DPCON[i] of the down control signal DPCON may correspond to the down selection signal SD, that is, the logic high level H.

When each bit GCON[i] of the gate control signal GCON is activated in the logic high level H in the normal operation mode, each bit UPCON[i] of the up control signal UPCON may correspond to the up selection signal SU, that is, the up signal UP, and each bit DPCON[i] of the down control signal DPCON may correspond to the down selection signal SD, that is, the inversion signal DNB of the down signal DN.

Referring to FIG. 13, in the calibration mode while the calibration enable signal CALEN is activated, the gate control circuit 500 of FIG. 1 may generate the sequentially increasing variation code VRC.

The proportional path circuit 300 may generate the down control signal DPCON[3:0] sequentially increasing based on the gate control signal GCON[3:0] sequentially increasing and the up control signal UPCON[3:0] having a fixed value, for example, of '0000'. As will be described below with reference to FIGS. 18 and 19, the frequency of the recovered clock signal CLK may increase as the up control signal UPCON[3:0] increases, and also the frequency of the recovered clock signal CLK may increase as the down control signal DPCON[3:0] increases. As a result, the frequency of the recovered clock signal CLK may sequentially increase as the gate control signal GCON increases in the calibration mode.

As such, the gain control circuit 500 may generate the gate control signal GCON sequentially varying and the proportional path circuit 300 may generate the up control signal UPCON having a fixed value and the down control signal DPCON sequentially varying, in the calibration mode. As a result, the frequency of the recovered clock signal CLK may sequentially vary according to the gate control signal GCON sequentially varying and the step code STC corresponding to the frequency step $f_{BB}$ may be determined by measuring the frequency variation amount.

Each of the up control signal UPCON[3:0] and the down control signal DPCON[3:0] may incrementally increase as the gate control signal GCON[3:0] incrementally increases in case of FIG. 7. In contrast, only the up control signal UPCON[3:0] may incrementally increase as the gate control signal GCON[3:0] incrementally increases in case of FIG. 10, and only the down control signal DPCON[3:0] may incrementally increase as the gate control signal GCON[3:0] incrementally increases in cased of FIG. 13. The embodiment of FIG. 7 may have an advantage that both of the up path and the down path may be calibrated at the same time. In contrast, the embodiments of FIGS. 10 and 13 may have an advantage that calibration resolution may be enhanced because the frequency increment according to increase of the gate control signal GCON[3:0] is reduced to a half value in comparison with the case of FIG. 7.

Figure 14:
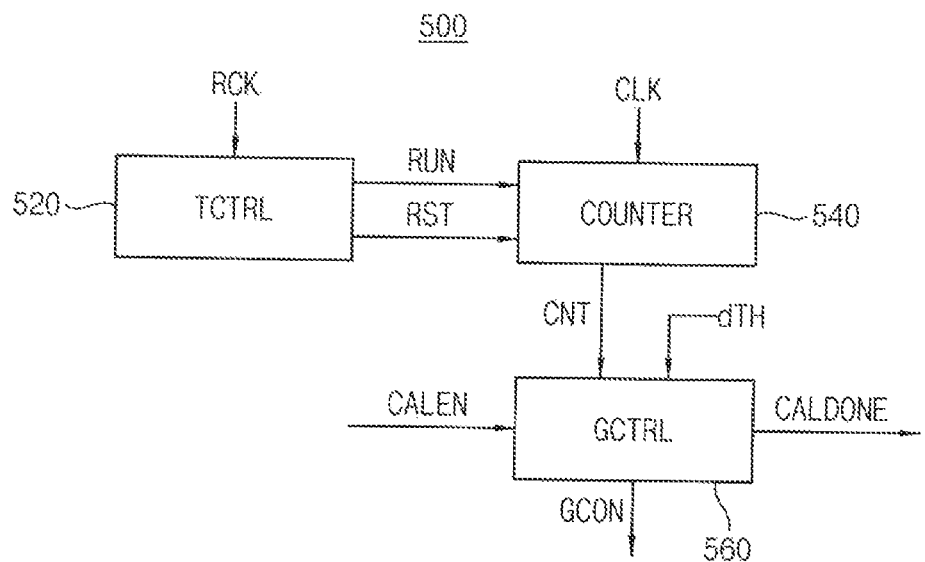
FIG. 14 is a block diagram illustrating a gain control circuit included in the clock data recovery circuit, according to an exemplary embodiment.

FIG. 14 is a block diagram illustrating a gain control circuit included in the clock data recovery circuit of FIG. 1, according to an exemplary embodiment.

Referring to FIG. 14, a gain control circuit 500 may include a timing controller TCTRL 520, a counter 540 and a gain controller GCTRL 560.

The timing controller 520 may generate a count start signal RUN and a count stop signal RST based on a reference clock signal RCK in a calibration mode. The counter 540 may generate a count signal CNT by counting a frequency of the recovered clock signal CLK based on the count start signal RUN and the count stop signal RST in the calibration mode. The gain controller 560 may output the variation code VRC, which varies sequentially, as the gate control signal GCON and determine a step code STC corresponding to the frequency step $f_{BB}$ based on a value of the count signal CNT. The gain controller 560 may activate a calibration done signal CALDONE when the step code STC is determined. The calibration done signal CALDONE may be provided to a control circuit of a receiver including the clock data recovery circuit and the control circuit may control the receiver to start the normal operation mode in response to the activation of the calibration done signal CALDONE.

In the normal operation mode, the gain control circuit 500 may output the step code STC as the gain control signal GCON, which is determined in the calibration mode.

Figure 15:
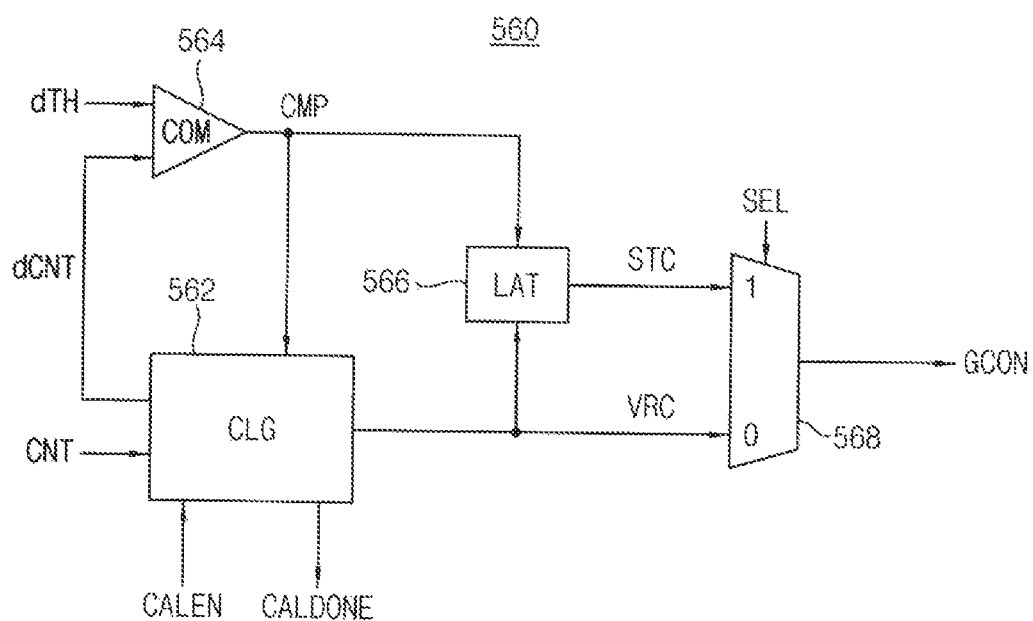
FIG. 15 is a block diagram illustrating a gain controller included in the gain control circuit, according to an exemplary embodiment.

FIG. 15 is a block diagram illustrating a gain controller included in the gain control circuit of FIG. 14, according to an exemplary embodiment.

Referring to FIG. 15, a gain controller 560 may include a control logic CLG 562, a comparator COM 564, a storage circuit LAT 566 and a selector 568.

The comparator 564 may compare a frequency variation amount dCNT of the recovered clock signal CLK with a reference value dTH to generate a comparison signal CMP in the calibration mode. The control logic 562 may generate the variation code VRC and provide the frequency variation amount dCNT of the recovered clock signal CLK based on the value of the count signal CNT in the calibration mode. The control logic 562 may determine the step code STC based on the comparison signal CMP in the calibration mode. When the step code STC is determined, the control logic 562 may activate the calibration done signal CALDONE and store the determined step code STC in the storage circuit 566. In some exemplary embodiments, the storage circuit 566 may include a latch circuit that latches the variation code VRC in synchronization with the comparison signal CMP. The selector 568 may output the variation code VRC from the control logic 562 as the gate control signal GCON in the calibration mode and output the step code STC from the storage circuit 566 as the gate control signal GCON in a normal operation mode. The operation of the selector 568 may be performed based on a selection signal SEL. The selection signal SEL may be the calibration enable signal CALEN itself or a signal generated by the control logic 562 based on the calibration enable signal CALEN.

Figure 16:
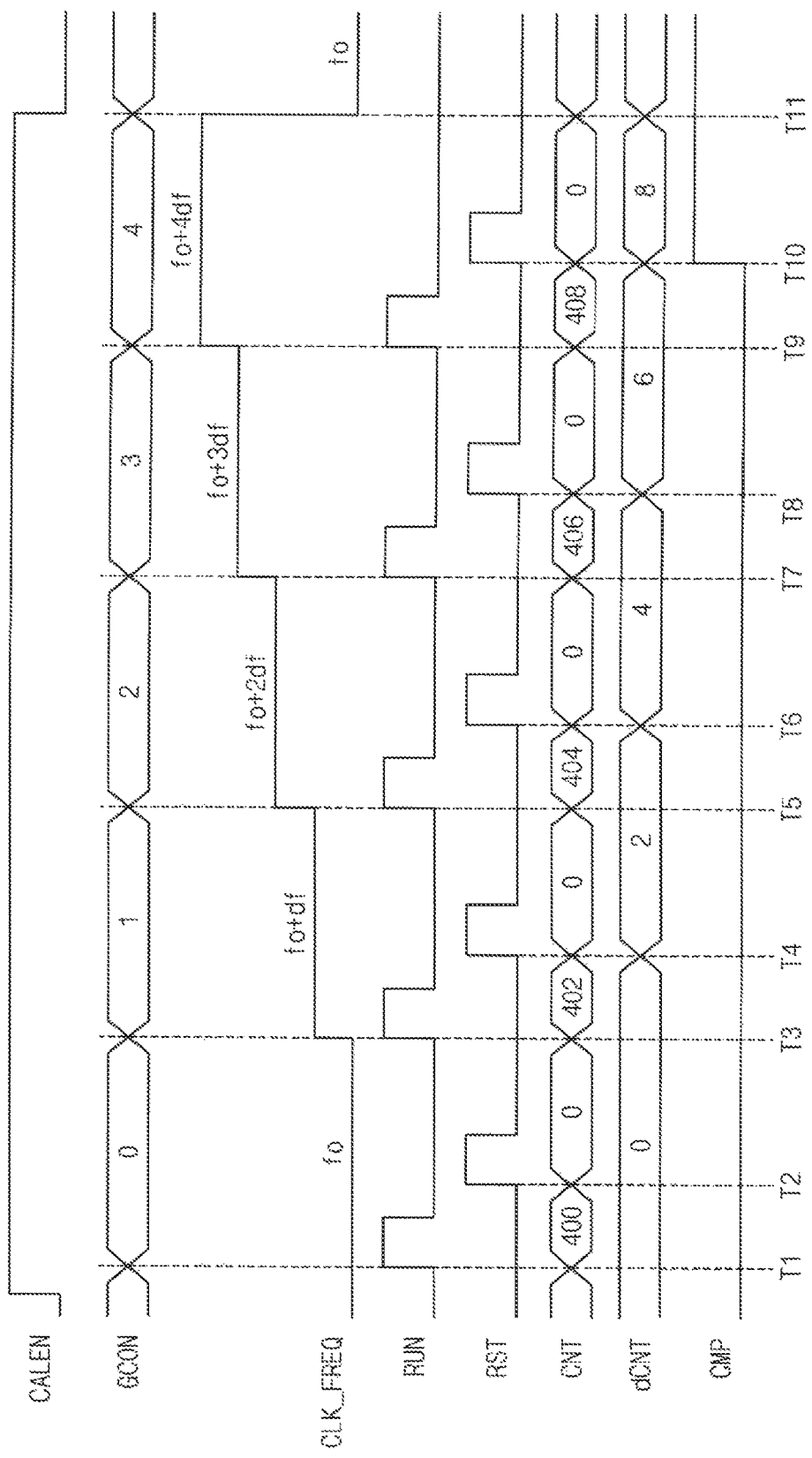
FIG. 16 is a timing diagram illustrating operation of the gain control circuit in a calibration mode, according to an exemplary embodiment.

FIG. 16 is a timing diagram illustrating operation of the gain control circuit of FIG. 14 in a calibration mode, according to an exemplary embodiment.

Referring to FIGS. 14, 15 and 16, the calibration mode may start by activating the calibration enable signal CALEN. The odd-numbered time points T1, T3, T5, T7, T9 and T11 may indicate timings of variation of the gain control signal GCON. The control logic 562 may increase the value of the gain control signal GCON in the calibration mode, that is, the value of the variation code VRC sequentially at the odd-numbered time points T1, T3, T5, T7, T9 and T11. According to the increase of the gain control signal GCON, the frequency CLK_FREQ of the recovered clock signal CLK may increase by a unit amount df from an initial frequency $f_o$.

The odd-numbered time points T1, T3, T5, T7, T9 and T11 may indicate count start timings of the counter 540 and the even-numbered time points T2, T4, T6, T8 and T10 may indicate count stop timings of counter 540. In other words, the timing controller 520 may activate the count start signal RUN at the odd-numbered time points T1, T3, T5, T7, T9 and T11 and activate the count stop signal RST at the even-numbered time points T2, T4, T6, T8 and T10.

The counter 540 may generate the count signal CNT by counting the number of clock cycles of the recovered clock signal CLK in synchronization with the count start signal RUN and the count stop signal RST. Thus the count signal CNT may indicate the frequency CLK_FREQ of the recovered clock signal CLK corresponding to the varying values of the gain control signal GCON. The control logic 562 may calculate and provide the frequency variation amount dCNT based on the count value, for example, of '400' corresponding to the initial frequency $f_o$. The comparator 564 may compare the frequency variation amount dCNT and the reference value dTH to generate the comparison signal CMP. For example, the comparison signal CMP may maintain the logic low level while the frequency variation amount dCNT is smaller than the reference value dTH and the comparison signal CMP may be activated to the logic high level at the time point T10 when the frequency variation amount dCNT exceeds the reference value dTH. The control logic 562 may activate the above-mentioned calibration done signal CALDONE in response to the activation of the comparison signal CMP.

For example, when it is assumed that the frequency of the reference clock signal RCK is 25 MHz, the count period T1~T2 is four cyclic periods of the reference clock signal RCK and the target frequency of the recovered clock signal CLK is 2500 MHz, the count value corresponding to the initial frequency $f_o$ is '400'. If the target frequency step $f_{BB}$ is 40 MHz, the corresponding frequency variation amount dCNT is '6.4'. In this case, as illustrated in FIG. 16, the comparison signal CMP maintains the deactivated state until the frequency variation amount is '6' and the comparison signal is activated when the frequency variation amount becomes '8'. As a result, the value of the step code STC, that is, the value of the gain control signal GCON corresponding to the target frequency step $f_{BB}$ of 40 MHz may be determined approximately to be '3' or '4'.

As the count period T1~T2 is increased, the calibration resolution may be increased. Also the calibration resolution may be increased as capacitance variation amount of a varactor array is decreased as will be described with reference to FIGS. 18 and 19. The frequency step $f_{BB}$ may be determined to be closer to the target value as the calibration resolution is increased, but the calibration time and the circuit size may be increased so as to enhance the calibration resolution. Accordingly the calibration resolution may be determined properly considering various factors in trade-off relation.

Figure 17:
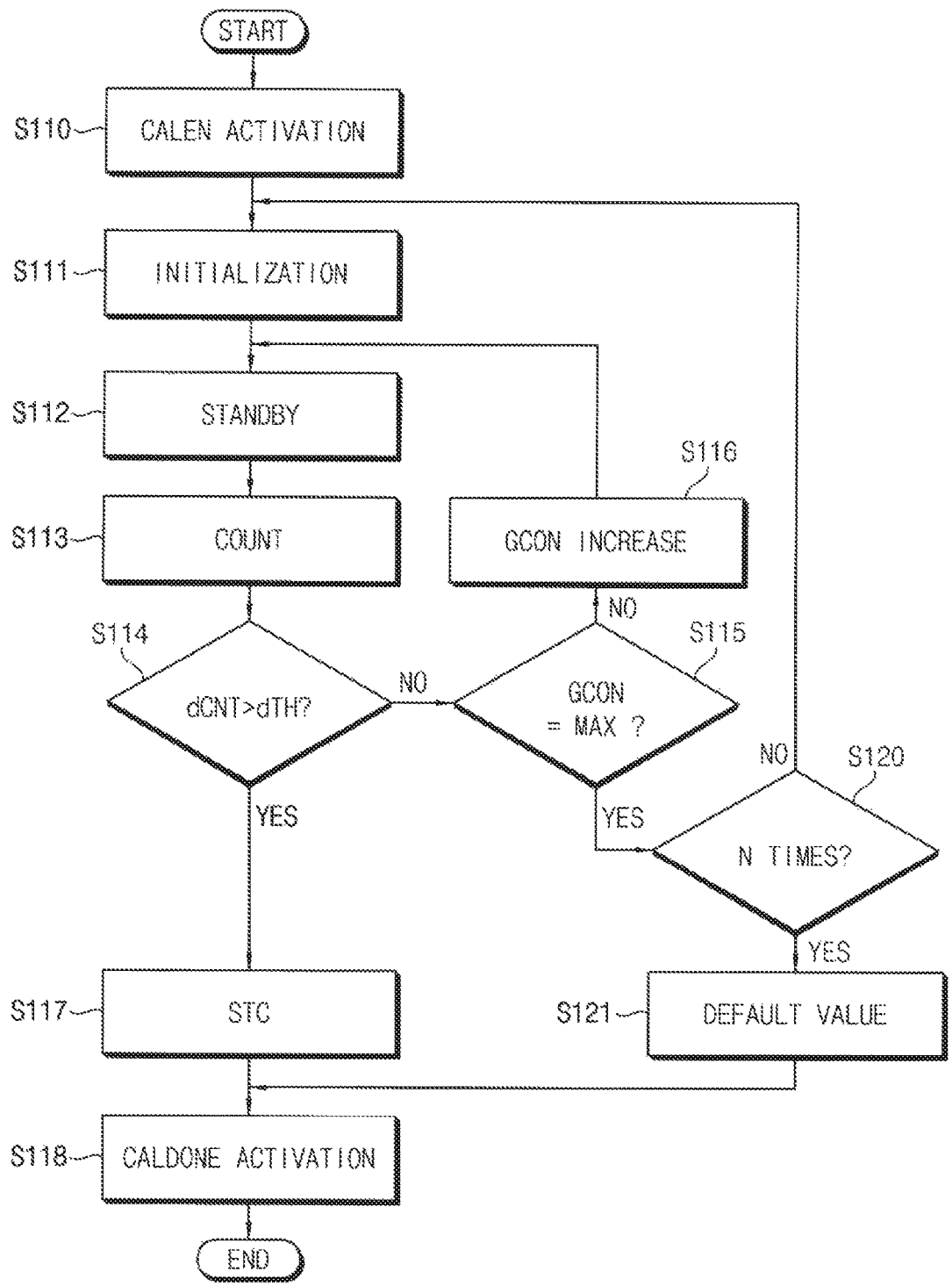
FIG. 17 is a flow chart illustrating a method of calibrating a frequency step according to an exemplary embodiment.

FIG. 17 is a flow chart illustrating a method of calibrating a frequency step according to an exemplary embodiment.

Referring to FIGS. 14 through 17, the calibration enable signal CALEN is activated (S110) when it is ready for starting the calibration mode. As described above, the calibration enable signal CALEN may be provided from a control circuit of a receiver including the clock data recovery circuit.

When the calibration mode starts, the gain control circuit 500 may initialize values and circuit states for calibration of the frequency step $f_{BB}$ (S111). For example, the gain control circuit 500 may initialize the gain control signal GCON to a minimum value.

After that, the gain control circuit 500 may standby for a predetermined time interval, for example, several periods of the reference clock signal RCK (S112). The standby time interval is to secure a settle time of the oscillation circuit 400.

After the standby time interval, the count 540 of the gain control circuit 500 may count the frequency of the recovered clock signal CLK (S113). The comparator 564 of the gain controller 560 may compare the frequency variation amount dCNT with the reference value dTH (S114).

When the frequency variation amount dCNT is greater than the reference value dTH (S114: YES), the gain control circuit 500 may store the step code STC in the storage circuit 566 (S117). Also the gain control circuit 500 may activate the calibration done signal CALDONE (S118) and then the calibration mode may be ended.

When the frequency variation amount dCNT is smaller than the reference value dTH (S114: NO), the control logic 562 of the gain control circuit 500 may determine whether the gain control signal GCON is a maximum value MAX (S115). When the gain control signal GCON is not the maximum value MAX (S115: NO), the gain control circuit 500 may increase the value of the gain control signal GCON (S116) and repeat the above described processes.

When the gain control signal GCON corresponds to the maximum value (S115: YES), the control logic (562) may determine whether the scan operation increasing the gain control signal GCON from the minimum value to the maximum value MAX has been performed N times (S120, where N is a positive integer. When the scan operation is not performed N times (S120: NO), the gain control circuit 500 may initialize the gain control signal GCON to the minimum value and repeat the above described processes. When the scan operation is performed N times, the gain control circuit 500 may determine failure of the calibration and store a default value in the storage circuit 566 (S121).

Figure 18:
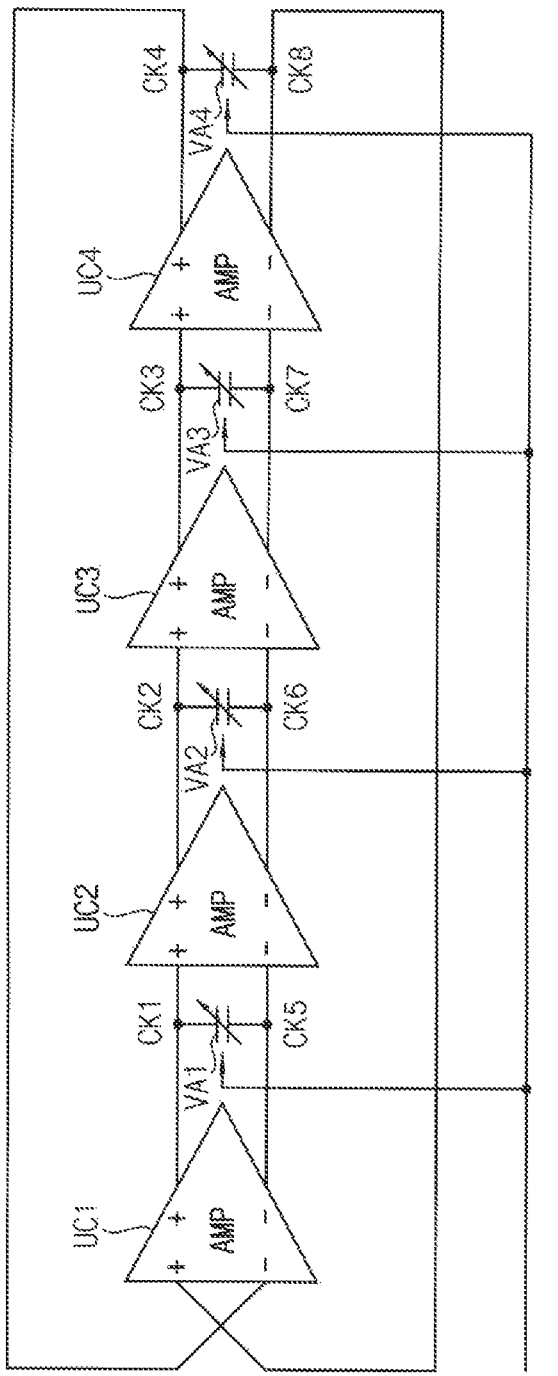
FIG. 18 is a diagram illustrating an oscillation circuit included in the clock data recovery circuit, according to an exemplary embodiment.
Figure 19:
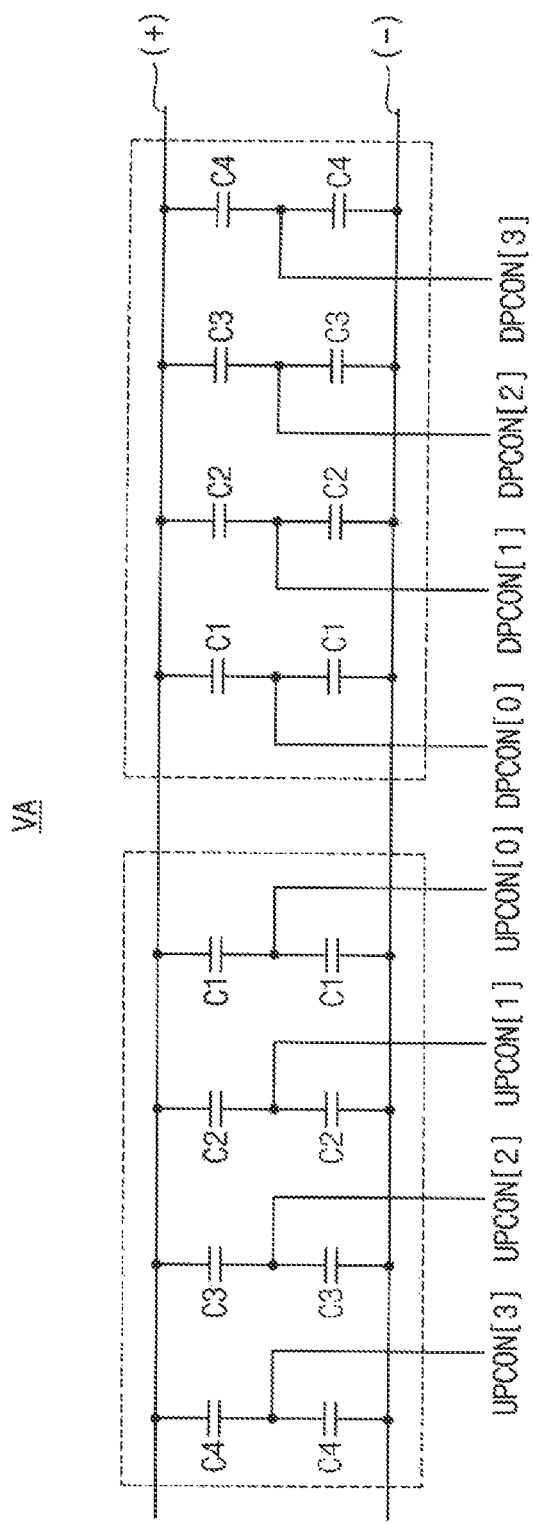
FIG. 19 is a diagram illustrating a varactor array included in the oscillation circuit, according to an exemplary embodiment.
Figure 20:
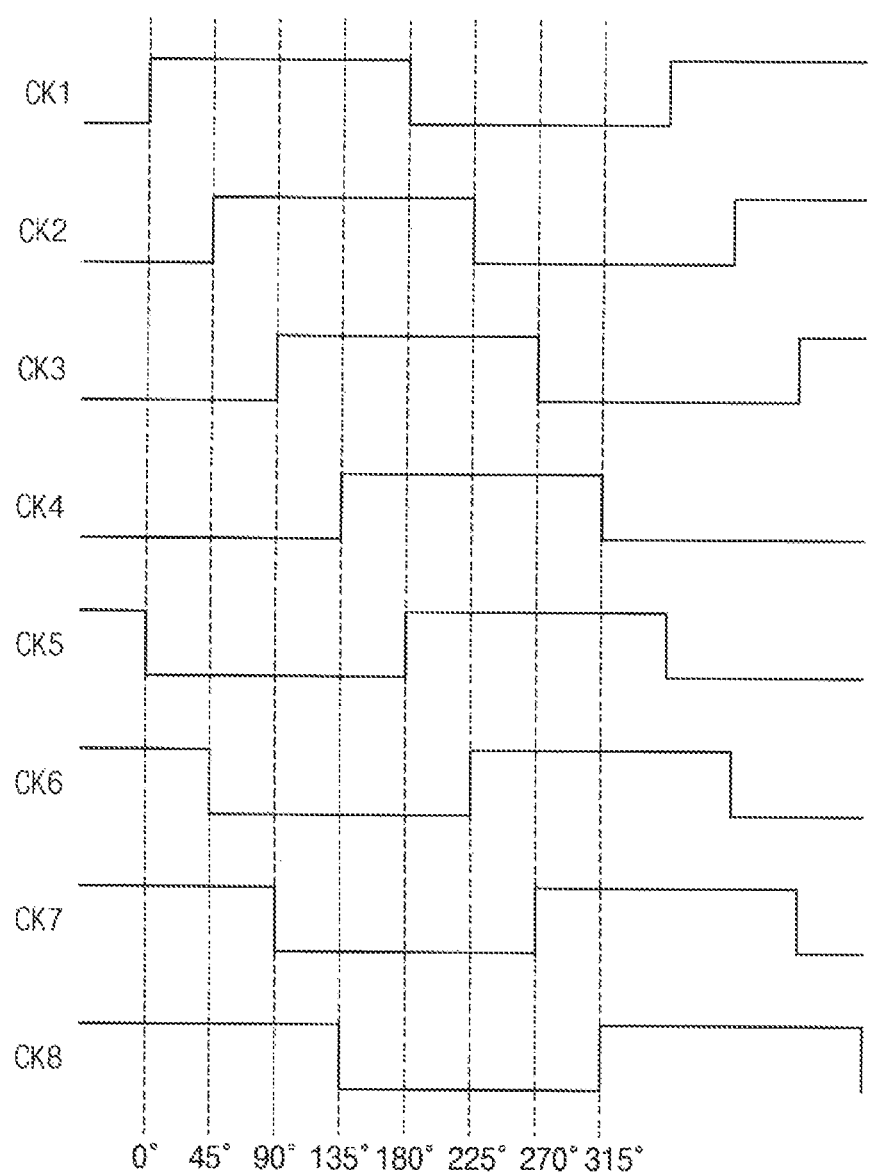
FIG. 20 is a timing diagram illustrating an operation of the oscillation circuit, according to an exemplary embodiment.

FIG. 18 is a diagram illustrating an oscillation circuit included in the clock data recovery circuit of FIG. 1, according to an exemplary embodiment. FIG. 19 is a diagram illustrating an exemplary embodiment of a varactor array included in the oscillation circuit of FIG. 18. FIG. 20 is a timing diagram illustrating an operation of the oscillation circuit of FIG. 18, according to an exemplary embodiment.

The circuits controlled by the integral control signal IPCON from the integral path circuit 200 and the circuits controlled by the automatic frequency control code AFCC from the automatic frequency control circuit 600 are omitted in FIG. 18.

The operation voltage and/or the operation current of an oscillation circuit 400a may be controlled by the integral control signal IPCON and/or the automatic frequency control code AFCC. According to such control schemes, the oscillation circuit 400a may be implemented in various configurations such as a current-controlled oscillator (CCO), a voltage-controlled oscillator (VCO), a digitally-controlled oscillator DCO, and so on.

Referring to FIG. 18, the oscillation circuit 400a may include a ring oscillator, which includes a plurality of unit circuits UC1, UC2, UC3, UC4 and a plurality of varactor arrays VA1, VA2, VA3, VA4 coupled to nodes between the unit circuits UC1~UC4. FIG. 18 illustrates a non-limiting example embodiment of the four unit circuits and the number of the unit circuits may be determined variously.

The unit circuits UC1~UC4 may be cascade-connected sequentially and an output from the last unit circuit UC4 may be provided as an input to the first unit circuit UC1 to form the ring oscillator. As illustrated in FIG. 18, the unit circuits UC1~UC4 may be implemented as differential amplifiers AMP. The first unit circuit UC1 may generate a differential pair of a first clock signal CK1 and a fifth clock signal CK5, the second unit circuit UC2 may generate a differential pair of a second clock signal CK2 and a sixth clock signal CK6, the third unit circuit UC3 may generate a differential pair of a third clock signal CK3 and a seventh clock signal CK7, and the fourth unit circuit UC4 may generate a differential pair of a fourth clock signal CK4 and a eighth clock signal CK8. One of the first through eighth clock signals CK1~CK8 may be provided as the recovered clock signal CLK.

The varactor arrays VA1~VA4 may adjust the frequency of the recovered clock signal CLK by the frequency step $f_{BB}$ based on the up control signal UPCON and the down control signal DPCON.

FIG. 19 illustrates one varactor array VA and the varactor arrays VA1~VA4 in FIG. 18 may have the same configuration as FIG. 19, for example.

Referring to FIG. 19, the varactor array may include a plurality of capacitors C1, C2, C3, C4 connected in parallel between a first terminal (+) and a second terminal (−). The multiple bits UPCON[0]~UPCON[3] of the up control signal UPCON and the multiple bits DPCON[0]~DPCON[3] of the down control signal DPCON may be applied to the capacitors C1~C4, respectively. If a voltage of the logic high level is applied to an end of each capacitor, capacitance is decreased relatively and thus the frequency of the recovered clock signal CLK may be increased. In contrast, if a voltage of the logic low level is applied to an end of each capacitor, capacitance is increased relatively and thus the frequency of the recovered clock signal CLK may be decreased.

In some exemplary embodiments, the size of the second capacitor C2 may be double the size of the first capacitor C1, the size of the third capacitor C3 may be double the size of the second capacitor C2 and the size of the fourth capacitor C4 may be double the size of the third capacitor C3. Though such configuration, the magnitude of the frequency step $f_{BB}$ may be binarized.

In the normal operation mode, all of the multiple bits UPCON[0]~UPCON[3] of the up control signal UPCON may have the logic low level when the up signal UP is deactivated, and the some bits of the up control signal UPCON corresponding to the step code STC may transition to the logic high level when the up signal UP is activated. In the normal operation mode, all of the multiple bits DPCON[0]~DPCON[3] of the down control signal DPCON may have the logic high level when the down signal DN is deactivated, and the some bits of the down control signal DPCON corresponding to the step code STC may transition to the logic low level when the down signal DN is activated. As a result, the frequency of the recovered clock signal CLK may be increased by the frequency step $f_{BB}$ when the up signal UP is activated and the frequency of the recovered clock signal CLK may be decreased by the frequency step $f_{BB}$ when the down signal DN is activated.

In the exemplary embodiment of FIG. 18, the up control signal UPCON and the down control signal DPCON may be commonly applied to all of the varactor arrays VA1~VA4. In this case, the phase difference of the first through eighth clock signals CK1~CK8 may be uniform to be 45 degrees as illustrated in FIG. 20.

Figure 21:
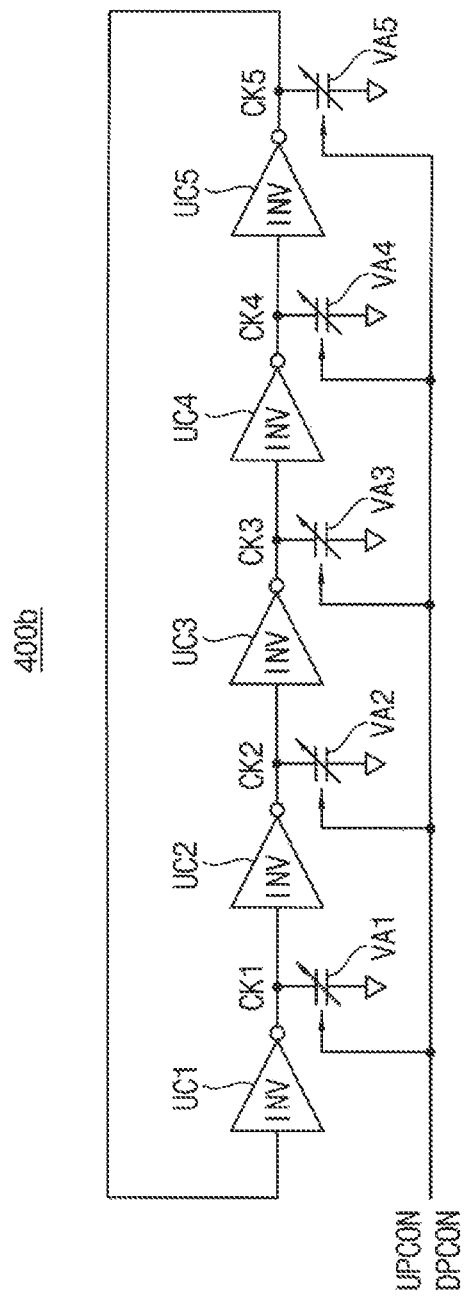
FIG. 21 is a diagram illustrating an oscillation circuit included in the clock data recovery circuit, according to an exemplary embodiment.

FIG. 21 is a diagram illustrating an oscillation circuit included in the clock data recovery circuit of FIG. 1, according to an exemplary embodiment.

Referring to FIG. 21, an oscillation circuit 400b may include a ring oscillator, which includes a plurality of unit circuits UC1~UC5 and a plurality of varactor arrays VA1~VA5 coupled to nodes between the unit circuits UC1~UC5. FIG. 21 illustrates a non-limiting example embodiment of the five unit circuits and the number of the unit circuits may be determined variously.

The unit circuits UC1~UC5 of FIG. 21 may be implemented as inverters to form a single-ended ring oscillator, whereas the unit circuits UC1~UC4 of FIG. 18 are implemented as the differential amplifiers. The other repeated descriptions are omitted.

Figure 22:
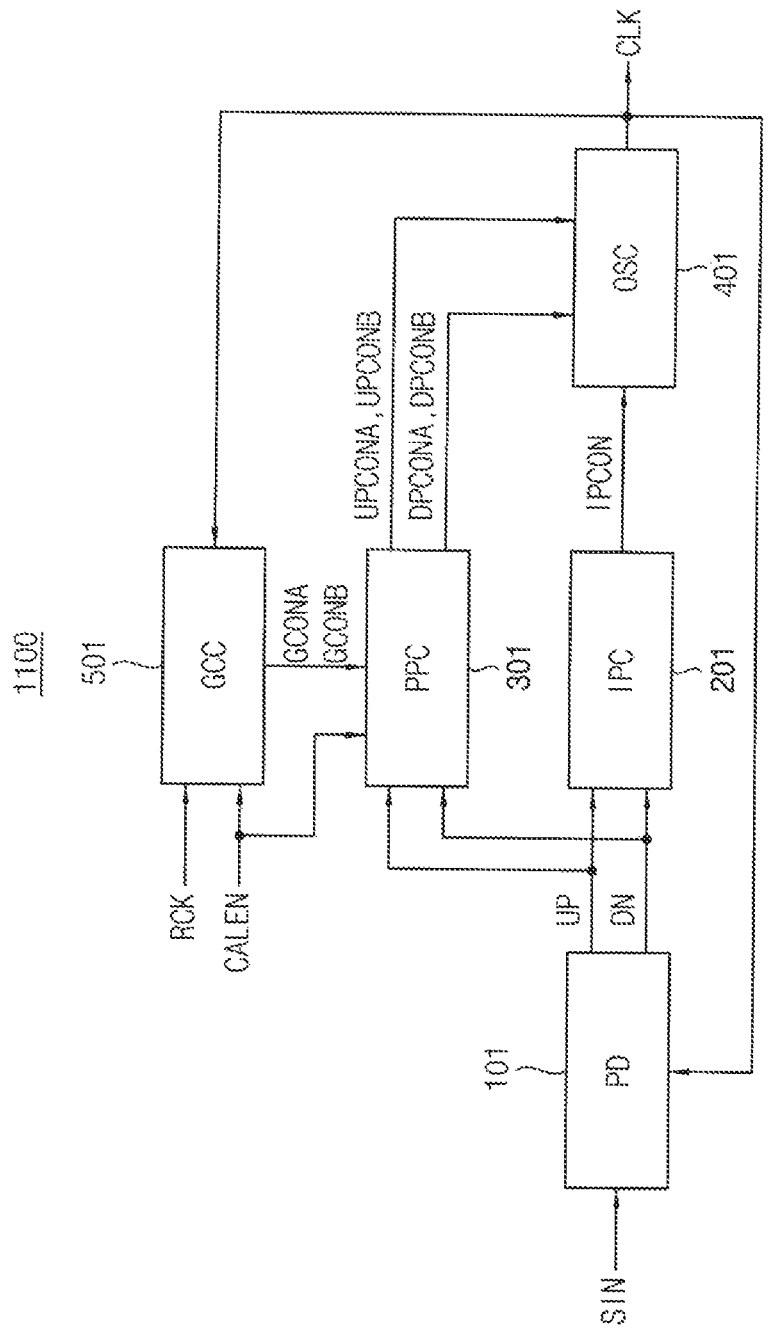
FIG. 22 is a block diagram illustrating an integrated circuit according to an exemplary embodiment.

FIG. 22 is a block diagram illustrating an integrated circuit according to an exemplary embodiment.

Referring to FIG. 22, an integrated circuit 1100 may include a phase detector PD 101, an integral path circuit IPC 201, a proportional path circuit PPC 301, an oscillation circuit OSC 401, and a gain control circuit GCC 501. The integrated circuit of FIG. 22 is similar to the clock data recovery circuit of FIG. 2, and thus repeated descriptions are omitted.

The phase detector 101 may receive a clock signal or a data signal as an input signal SIN. The integrated circuit 1100 may function as a phase-locked loop (PLL) when the input signal SIN is a clock signal, and the integrated circuit 1100 may function as a clock data recovery circuit as described above when the input signal SIN is a data signal.

In comparison with the proportional path circuit 300 and the gain control circuit 500 in FIG. 1, the proportional path circuit 301 and the gain control circuit 501 in FIG. 22 may generate a first gain control signal GCONA and first up and down control signals UPCONA and DPCONA corresponding to a first group, and a second gain control signal GCONB and second up and down control signals UPCONB and DPCONB corresponding to a second group.

Figure 23:
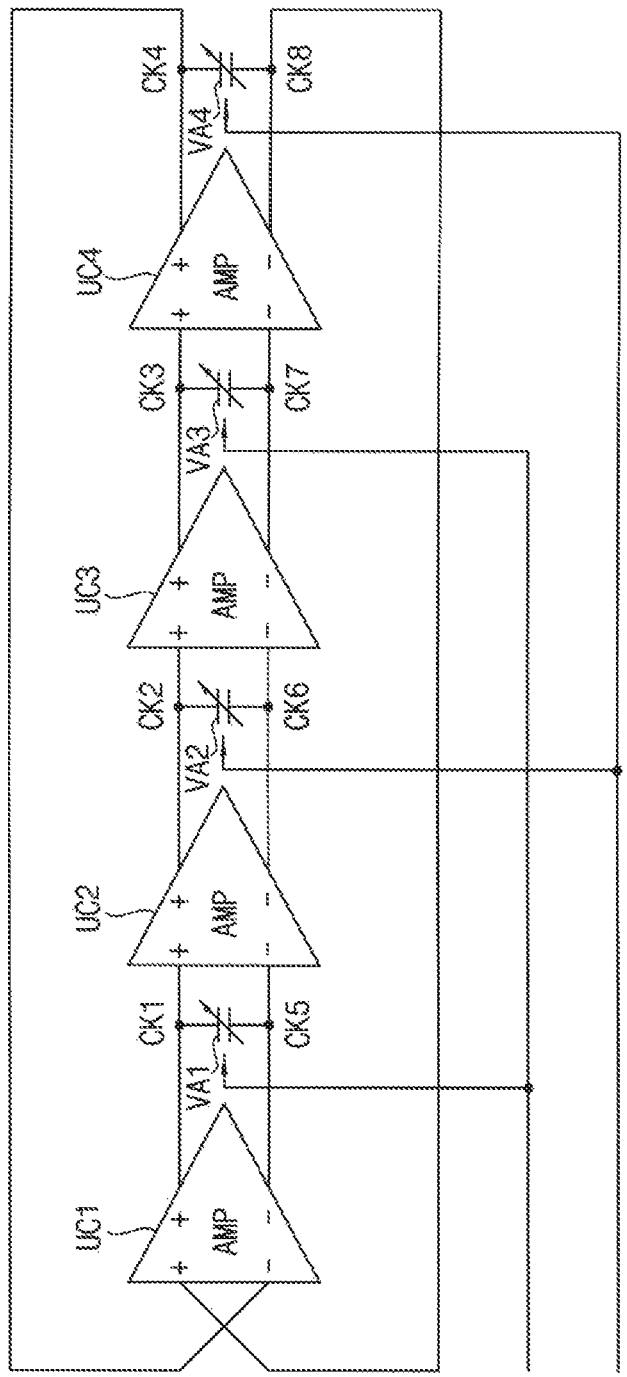
FIG. 23 is a diagram illustrating an oscillation circuit included in the clock data recovery circuit, according to an exemplary embodiment.
Figure 24:
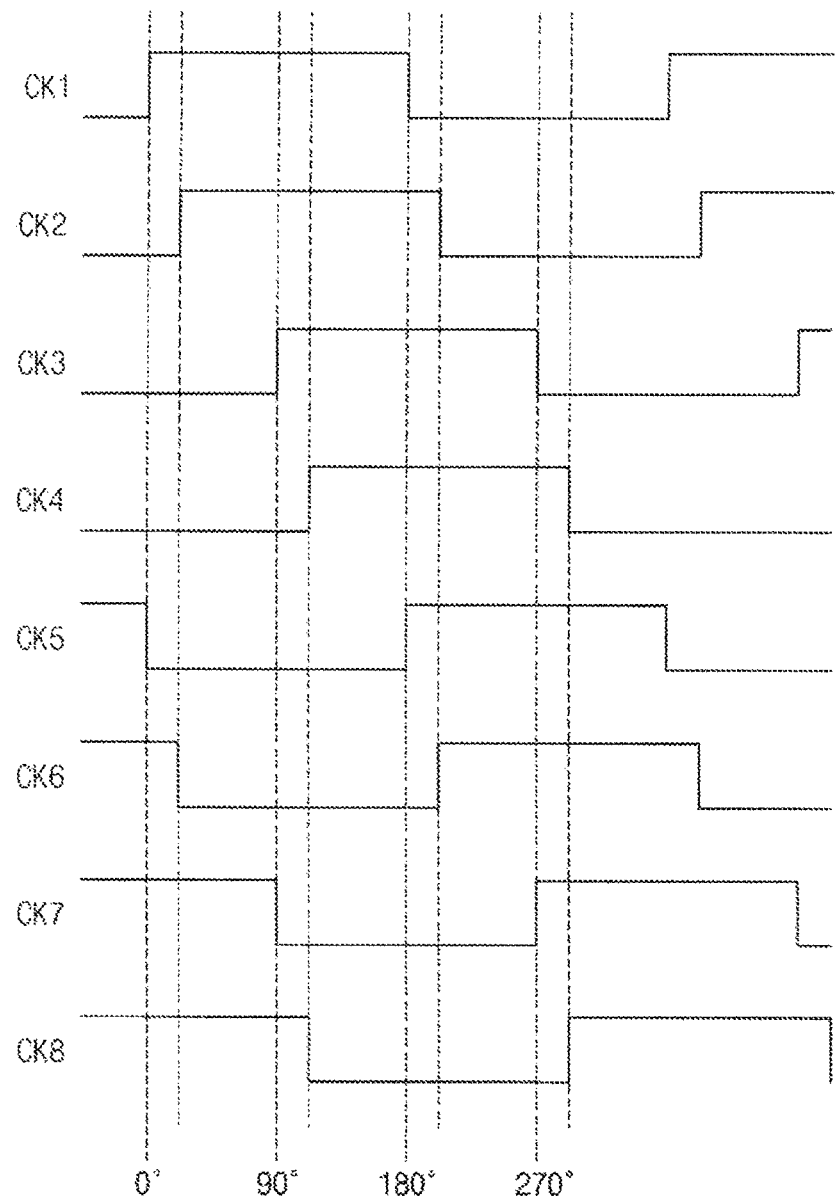
FIG. 24 is a timing diagram illustrating an operation of the oscillation circuit, according to an exemplary embodiment.

FIG. 23 is a diagram illustrating an oscillation circuit included in the clock data recovery circuit of FIG. 22, according to an exemplary embodiment. FIG. 24 is a timing diagram illustrating an operation of the oscillation circuit of FIG. 23, according to an exemplary embodiment. An oscillation circuit 401 of FIG. 23 is similar to the oscillation circuit 400a of FIG. 18 and thus the repeated descriptions are omitted.

Referring to FIG. 23, a plurality of varactor arrays VA1~VA4 may be grouped into a plurality of array groups, for example, a first group and a second group, and a code value of the gate control signal GCON may be determined independently with respect to each of the array groups. For example, the first group may include the first varactor array VA1 and the third varactor array VA3, and the second group may include the second varactor array VA2 and the fourth varactor array VA4. The first up and down control signals UPCONA and DPCONA corresponding to the first gain control signal GCONA may be applied to the varactor arrays VA1 and VA3 of the first group, and the second up and down control signals UPCONB and DPCONB corresponding to the second gain control signal GCONB may be applied to the varactor arrays VA2 and VA4 of the second group. The above-described calibration of the frequency step $f_{BB}$ may be performed twice so as to determine the step code STC for the first group and the second group independently.

In this case, as illustrated in FIG. 24, the phase difference of the clock signals CK1, CK3, CK5 and CK7 of the first group may be uniform to be 90 degrees, and also the phase difference of the clock signals CK2, CK4, CK6 and CK8 of the second group may be uniform to be 90 degrees. In contrast, the phase difference between the clock signals of the first group and the second group may be different from 45 degrees because the frequency step $f_{BB}$ is determined independently with respect to the first group and the second group. The varactors may be turned on and off by units of 2N varactors in case of FIG. 18, whereas the varactors may be turned on and off by units of N varactors in case of FIG. 23. As a result, with respect to the same configuration of varactors, the calibration resolution may be doubled in case of FIG. 23 in comparison with FIG. 18.

Figure 25:
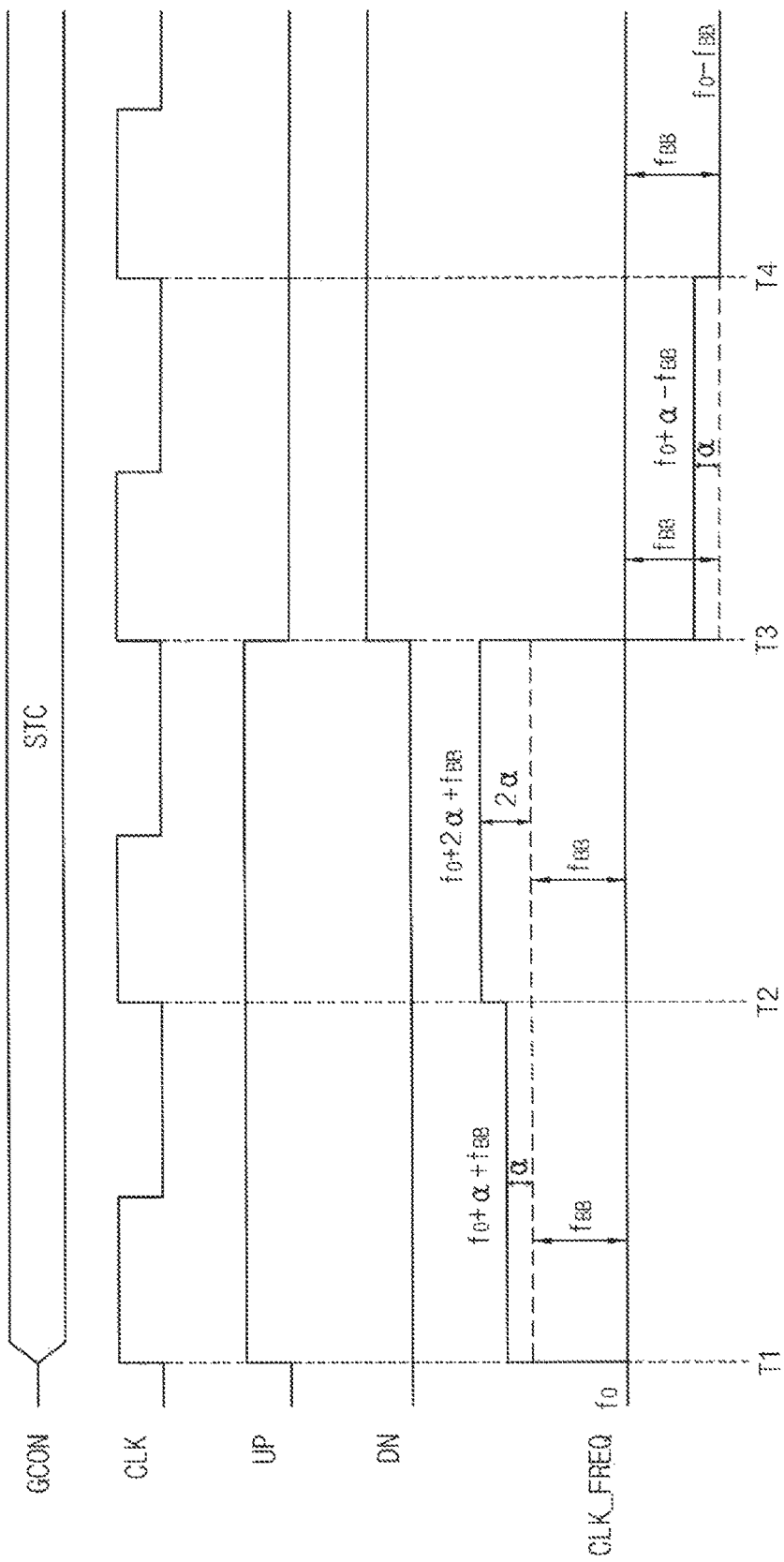
FIGS. 25 and 26 are timing diagrams illustrating operations of a clock data recovery circuit in a normal operation mode according to an exemplary embodiment.
Figure 26:
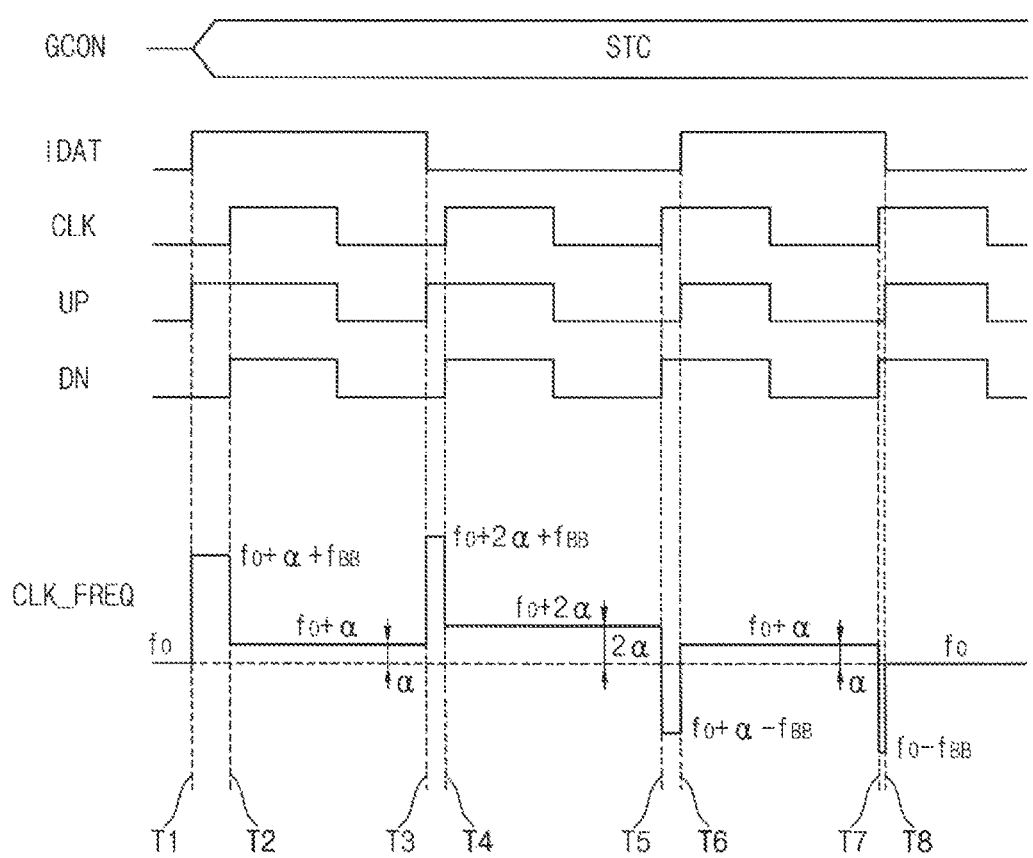

FIGS. 25 and 26 are timing diagrams illustrating operations of a clock data recovery circuit in a normal operation mode according to an exemplary embodiment.

FIG. 25 illustrates an example that a phase detector in the clock data recovery circuit is implemented with a bang-bang phase detector. The step code STC determined in the calibration mode is provided as the gain control signal in the normal operation mode. As described above, the frequency step $f_{BB}$ may be determined to be uniform regardless of the operational conditions through calibration of the step code STC according to an exemplary embodiment.

Referring to FIGS. 1 and 25, the bang-bang phase detector may generate the up signal UP and the down signal DN such that the up signal UP is activated and the down signal DN is deactivated when the input data signal IDAT precedes the recovered clock signal CLK, whereas the down signal DN is activated and the up signal UP is deactivated when the input data signal IDAT lags behind the recovered clock signal CLK.

The integral path circuit 200 may control the oscillation circuit 400 to increase or decrease the frequency CLK_FREQ of the recovered clock signal CLK by a unit amount a stepwise from the initial frequency $f_o$ based on the integration result of the up signal UP and the down signal DN. For example, as illustrated in FIG. 25, the frequency CLK_FREQ may increase sequentially by the unit amount a at time points T1 and T2 and decrease sequentially by the unit amount a at time points T3 and T4, based on the accumulation result of the up signal UP and the down signal DN.

The proportional path circuit 300 may control the oscillation circuit 400 to increase or decrease the frequency CLK_FREQ of the recovered clock signal CLK by the frequency step $f_{BB}$ in response to the up signal UP and the down signal DN. For example, as illustrated in FIG. 25, the frequency CLK_FREQ may increase by the frequency step $f_{BB}$ during the first time interval T1~T2 and the second time interval T2~T3, and decrease by the frequency step $f_{BB}$ during the third time interval T3~T4, based on the up signal UP and the down signal DN.

FIG. 26 illustrates an example that a phase detector in the clock data recovery circuit is implemented with a linear phase detector. The step code STC determined in the calibration mode is provided as the gain control signal in the normal operation mode. As described above, the frequency step $f_{BB}$ may be determined to be uniform regardless of the operational conditions through calibration of the step code STC according to exemplary embodiments.

Referring to FIGS. 1 and 26, the linear phase detector may generate the up signal UP and the down signal DN such that the up signal UP is activated longer than the down signal DN when the input data signal IDAT precedes the recovered clock signal CLK, whereas the down signal DN is activated longer than the up signal UP when the input data signal IDAT lags behind the recovered clock signal CLK.

The integral path circuit 200 may control the oscillation circuit 400 to increase or decrease the frequency CLK_FREQ of the recovered clock signal CLK by a unit amount a stepwise from the initial frequency $f_o$ based on the integration result of the up signal UP and the down signal DN. For example, as illustrated in FIG. 26, the frequency CLK_FREQ may sequentially increase by the unit amount a at time points T1 and T3 and sequentially decrease by the unit amount a at time points T5 and T7, based on the accumulation result of the up signal UP and the down signal DN.

The proportional path circuit 300 may control the oscillation circuit 400 to increase or decrease the frequency CLK_FREQ of the recovered clock signal CLK by the frequency step $f_{BB}$ in response to the up signal UP and the down signal DN. For example, as illustrated in FIG. 26, the frequency CLK_FREQ may increase by the frequency step $f_{BB}$ during the first time interval T1~T2 and the second time interval T3~T4, and decrease by the frequency step $f_{BB}$ during the third time interval T5~T6 and the fourth time interval T7~T8, based on the up signal UP and the down signal DN.

Figure 27:
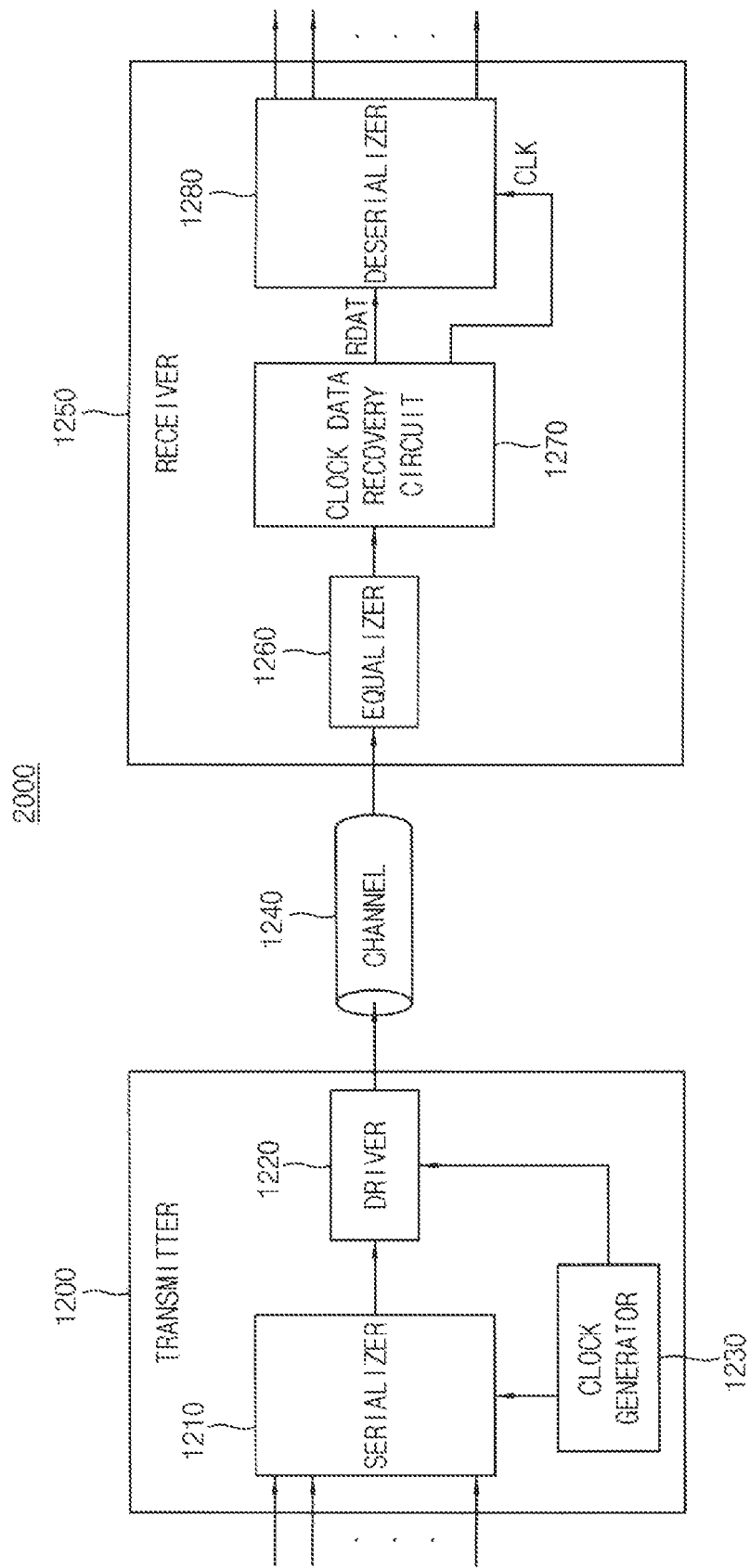
FIG. 27 is a block diagram illustrating a system according to an exemplary embodiment.

FIG. 27 is a block diagram illustrating a system according to an exemplary embodiment.

Referring to FIG. 27, a system 2000 may include a transmitter 1200, a communication channel 1240 and a receiver 1250.

The transmitter 1200 may transmit an input data signal to the receiver 1250 through the communication channel 1240. The transmitter 1200 may include a clock generator (e.g., a phase locked loop circuit) 1230 that generates a clock signal, and a driver 1220 that transmits the input data signal through the communication channel 1240 in response to the clock signal generated by the clock generator 1230. The transmitter 1200 may further include a serializer 1210, and the input data signal transmitted by the driver 1220 may be a signal serialized by the serializer 1210.

The receiver 1250 may include a clock data recovery circuit 1270 that generates a recovered clock signal CLK and a recovered data signal RDAT based on the input data signal received through the communication channel 1240. The clock data recovery circuit 1270 may be a clock data recovery circuit 1000 of FIG. 1. As described above, the clock data recovery circuit 1270 may implement uniform frequency transfer characteristic regardless of the operational conditions by controlling the gain of the proportional path so that the frequency step $f_{BB}$ of the recovered clock signal CLK may be uniform regardless of the operational conditions, and thus performance of the clock data recovery circuit 1270 and the receiver 1250 including the clock data recovery circuit 1270 may be enhanced.

In some exemplary embodiments, the communication channel 1240 may be a serial communication channel, the input data signal may be a serial input data signal, and the recovered data signal RDAT may be a serial recovered data signal. In this case, the receiver 1250 may further include a deserializer 1280 that deserializes the serial recovered data signal RDAT generated by the clock data recovery circuit 1270 based on the clock signal CLK generated by the clock data recovery circuit 1270. In some example exemplary, the receiver 1250 may further include an equalizer 1260 that performs an equalization operation on the input data signal received through the communication channel 1240.

According to exemplary embodiments, the communication channel 1240 may be any communication channel, such as an Ethernet, a peripheral component interconnect express (PCI-e), a serial advance technology attachment (SATA), a universal serial bus (USB), a DisplayPort (DP), etc., and the receiver 1250 may be any receiver of the Ethernet, PCI-e, SATA, USB, DP, etc.

The concepts of the present application may be applied to a receiver requiring clock data recovery function and any devices/systems including a receiver. For example, the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A clock data recovery circuit comprising:
   a phase detector configured to sample an input data signal based on a recovered clock signal to generate a recovered data signal, detect a phase difference between the input data signal and the recovered clock signal, and generate an up signal and a down signal based on the phase difference;
   a proportional path circuit configured to convert the up signal and the down signal to an up control signal and a down control signal based on a gate control signal;
   an integral path circuit configured to integrate the up signal and the down signal to generate an integral control signal;
   an oscillation circuit configured to generate the recovered clock signal based on the integral control signal and configured to adjust a frequency of the recovered clock signal by a frequency step based on the up control signal and the down control signal; and
   a gain control circuit configured to generate the gate control signal such that the frequency step is uniform independent of a bandwidth of the clock data recovery circuit that varies according to at least one of an operation voltage of the clock data recovery circuit, a current of the clock data recovery circuit, and process, voltage, and temperature variation (PVT) of the clock data recovery circuit.

2. The clock data recovery circuit of claim 1, wherein the gate control signal, the up control signal, and the down control signal are digital signals.

3. The clock data recovery circuit of claim 1, wherein the gain control circuit is configured to operate in a calibration mode to output a variation code, which sequentially increments, as the gate control signal to determine a step code corresponding to the frequency step, and
   wherein the gain control circuit is configured to operate in a normal operation mode to output the step code determined in the calibration mode as the gate control signal.

4. The clock data recovery circuit of claim 3, wherein the gain control circuit comprises:
   a timing controller configured to generate a count start signal and a count stop signal based on a reference clock signal in the calibration mode;
   a counter configured to generate a count signal by counting the frequency of the recovered clock signal based on the count start signal and the count stop signal in the calibration mode; and
   a gain controller configured to output the variation code, which sequentially varies, as the gate control signal to determine the step code corresponding to the frequency step based on a value of the count signal.

5. The clock data recovery circuit of claim 4, wherein the gain controller is configured to output the step code determined in the calibration mode as the gate control signal in the normal operation mode.

6. The clock data recovery circuit of claim 4, wherein the gain controller is configured to measure a frequency variation amount of the recovered clock signal based on the value of the count signal and compare the frequency variation amount with a reference value to determine the step code.

7. The clock data recovery circuit of claim 4, wherein the gain controller comprises:
   a comparator configured to compare a frequency variation amount of the recovered clock signal with a reference value to generate a comparison signal in the calibration mode;
   a control logic configured to generate the variation code, provide the frequency variation amount of the recovered clock signal based on the value of the count signal, and determine the step code based on the comparison signal in the calibration mode;
   a storage circuit configured to store the step code; and
   a selector configured to output the variation code from the control logic as the gate control signal in the calibration mode and output the step code from the storage circuit as the gate control signal in the normal operation mode.

8. The clock data recovery circuit of claim 1, wherein the proportional path circuit comprises:
   an up proportional path circuit configured to convert the up signal to the up control signal based on the gate control signal; and
   a down proportional path circuit configured to convert the down signal to the down control signal based on the gate control signal.

9. The clock data recovery circuit of claim 8, wherein the up proportional path circuit comprises:
   an up signal selector configured to select a first voltage signal or the up signal to output an up selection signal; and
   a plurality of up bit selectors configured to select a second voltage signal or the up selection signal based on multiple bits of the gate control signal to output multiple bits of the up control signal, respectively.

10. The clock data recovery circuit of claim 9, wherein the down proportional path circuit comprises:
    a down signal selector configured to select a third voltage signal or an inversion signal of the down signal to output a down selection signal; and
    a plurality of down bit selectors configured to select a fourth voltage signal or the down selection signal based on the multiple bits of the gate control signal to output multiple bits of the down control signal, respectively.

11. The clock data recovery circuit of claim 8, wherein the up proportional path circuit and the down proportional path circuit are enabled in a calibration mode to determine a value of the gate control signal.

12. The clock data recovery circuit of claim 8, wherein only one of the up proportional path circuit and the down proportional path circuit is enabled in a calibration mode to determine a value of the gate control signal.

13. The clock data recovery circuit of claim 1, wherein the oscillation circuit comprises a ring oscillator, the ring oscillator comprising:
- a plurality of unit circuits configured to generate the recovered clock signal; and
- a plurality of varactor arrays coupled to nodes between circuits among the plurality of unit circuits, the plurality of varactor arrays configured to adjust the frequency of the recovered clock signal by the frequency step based on the up control signal and the down control signal.

14. The clock data recovery circuit of claim 13, wherein the plurality of varactor arrays is grouped into a plurality of array groups, and a code value of the gate control signal is determined independently with respect to each group among the plurality of array groups.

15. A receiver comprising:
- a clock data recovery circuit configured to generate a recovered clock signal and a recovered data signal based on an input data signal that is received through a communication channel, the clock data recovery circuit comprising:
- a phase detector configured to sample the input data signal based on the recovered clock signal to generate the recovered data signal, detect a phase difference between the input data signal and the recovered clock signal, and generate an up signal and a down signal based on the phase difference;
- a proportional path circuit configured to convert the up signal and the down signal to an up control signal and a down control signal based on a gate control signal;
- an integral path circuit configured to integrate the up signal and the down signal to generate an integral control signal;
- an oscillation circuit configured to generate the recovered clock signal based on the integral control signal and configured to adjust a frequency of the recovered clock signal by a frequency step based on the up control signal and the down control signal; and
- a gain control circuit configured to generate the gate control signal such that the frequency step is uniform independent of a bandwidth of the clock data recovery circuit that varies according to at least one of an operation voltage of the clock data recovery circuit, a current of the clock data recovery circuit, and process, voltage, and temperature variation (PVT) of the clock data recovery circuit.

16. A clock data recovery circuit comprising:
- a phase detector configured to output control signals based on a phase difference between an input data signal a recovered clock signal that is a feedback signal to the phase detector;
- a proportional path circuit configured to receive the control signals and output skew between the input data signal and the recovered clock signal without filtering based on a gate control signal;
- an integral path circuit configured to receive the control signals, filter the control signals, and output an analog control signal based on filtering the control signals;
- an oscillator configured to receive the skew and the analog control signal and generate the recovered clock signal based on the skew and the analog control signal, a frequency of the recovered clock signal corresponding to a frequency of the analog control signal; and
- a gain control circuit configured to operate:
  - in a calibration mode to output a variation code based on a frequency variation of the recovered clock signal with respect to a reference clock signal as the gate control signal, and determine a step code corresponding to a frequency step of the recovered clock signal based on comparison of a reference value and the frequency variation of the recovered clock signal, and
  - in a normal operation mode to output the step code as the gate control signal, to control gain of the proportional path circuit to provide the frequency step of the recovered clock signal.

17. The clock data recovery circuit of claim 16, wherein the gain control circuit comprises:
- a timing controller configured to generate a count start signal and a count stop signal based on the reference clock signal;
- a counter configured to generate a count signal by counting the frequency of the recovered clock signal based on the count start signal and the count stop signal; and
- a gain controller configured to output the variation code, which varies incrementally, as the gate control signal to determine the step code corresponding to the frequency step of the recovered clock signal based on a value of the count signal.

18. The clock data recovery circuit of claim 17, wherein the gain controller comprises:
- a comparator configured to compare an amount of the frequency variation of the recovered clock signal with the reference value to generate a comparison signal;
- a control logic configured to generate the variation code, provide the amount of the frequency variation based on the value of the count signal, and determine the step code based on the comparison signal;
- a storage circuit configured to store the step code; and
- a selector configured to output the variation code from the control logic as the gate control signal in the calibration mode and output the step code from the storage circuit as the gate control signal in the normal operation mode based on a selection signal.

19. The clock data recovery circuit of claim 18, wherein the frequency step is uniform independent of a bandwidth of the clock data recovery circuit.

20. The clock data recovery circuit of claim 19, wherein the bandwidth of the clock data recovery circuit varies according to at least one of an operation voltage of the clock data recovery circuit, a current of the clock data recovery circuit, and process, voltage, and temperature variation (PVT) of the clock data recovery circuit.

* * * * *